(12) United States Patent
Fujiwara et al.

(10) Patent No.: US 7,919,806 B2
(45) Date of Patent: Apr. 5, 2011

(54) NONVOLATILE SEMICONDUCTOR MEMORY DEVICE AND FABRICATION METHOD THEREFOR

(75) Inventors: Ichiro Fujiwara, Kanagawa (JP); Hiroshi Aozasa, Tokyo (JP)

(73) Assignee: Sony Corporation, Tokyo (JP)

( * ) Notice: Subject to any disclaimer, the term of this patent is extended or adjusted under 35 U.S.C. 154(b) by 651 days.

(21) Appl. No.: 11/889,358

(22) Filed: Aug. 13, 2007

(65) Prior Publication Data
US 2008/0048241 A1 Feb. 28, 2008

(30) Foreign Application Priority Data

Aug. 22, 2006 (JP) .................................. 2006-225140

(51) Int. Cl.
*H01L 29/76* (2006.01)
(52) U.S. Cl. ........ 257/314; 257/310; 257/324; 257/325; 257/326; 257/411; 257/E21.179
(58) Field of Classification Search .................. 257/321, 257/324, 637, 310, 314, 325, 326, 411
See application file for complete search history.

(56) References Cited

U.S. PATENT DOCUMENTS

| 6,784,484 | B2 * | 8/2004 | Blomme et al. | 257/321 |
| 6,906,390 | B2 * | 6/2005 | Nomoto et al. | 257/406 |
| 2006/0261401 | A1 * | 11/2006 | Bhattacharyya | 257/316 |
| 2007/0029625 | A1 * | 2/2007 | Lue et al. | 257/411 |
| 2007/0166904 | A1 * | 7/2007 | Teo et al. | 438/197 |

OTHER PUBLICATIONS

Kennedy et al. Journal of Applied Physics, vol. 85, No. 6 (Mar. 1999), pp. 3319-3326.*

* cited by examiner

*Primary Examiner* — Wai-Sing Louie
(74) *Attorney, Agent, or Firm* — Rader, Fishman & Grauer PLLC

(57) ABSTRACT

Disclosed herein is a nonvolatile semiconductor memory device, including a memory transistor. The memory transistor has a channel formation region defined between two source and drain regions formed on a semiconductor substrate a bottom insulating film, a charge storage film and a top insulating film formed in order at least on the channel formation region, the charge storage film having a charge storage function, and a gate electrode formed on the top insulating film. The bottom insulating film is formed from a plurality of films containing nitrogen such that the content of nitrogen of a lowermost one of the films which contacts with the channel formation region and an uppermost one of the films which contacts with the gate electrode is higher than that of the other one or ones of the films which exist between the uppermost and lowermost films.

18 Claims, 15 Drawing Sheets

Eg=9.1eV
$\varepsilon_{ox}$=3.9

Eg=5.1eV
$\varepsilon_N$ =7.8

UNIT [atom/cm³]

| SAMPLE | PEAK CONCENTRATION | DEPTH (nm) @ FIRST PEAK | PEAK CONCENTRATION | DEPTH (nm) @ SECOND PEAK |
|---|---|---|---|---|
| #01 | 32.9 | 0.95 | 20.1 | 5.0 |
| #03 | 31.5 | 0.65 | 10.2 | 4.8 |
| #05 | 28.3 | 0.79 | 4.3 | 5.0 |
| #07 | 22.9 | 0.57 | 2.4 | 5.0 |
| #09 | 26.1 | 0.85 | 1.3 | 7.7 |
| #11 | 27.5 | 0.71 | | |
| #17 | | | 0.0 | 4.5 |

NONVOLATILE SEMICONDUCTOR MEMORY DEVICE AND FABRICATION METHOD THEREFOR

CROSS REFERENCES TO RELATED APPLICATIONS

The present invention contains subject matter related to Japanese Patent Application JP 2006-225140, filed in the Japan Patent Office on Aug. 22, 2006, the entire contents of which are incorporated herein by reference.

BACKGROUND OF THE INVENTION

1. Field of the Invention

This invention relates to a nonvolatile semiconductor memory device wherein a memory transistor includes a channel formation region, a gate electrode and a charge storage film disposed between the channel formation region and the gate electrode and having a charge storage function and also to a fabrication method for the nonvolatile semiconductor memory device.

2. Description of the Related Art

Nonvolatile semiconductor memory transistors can be roughly classified into a floating gate (FG) type and a metal-oxide-nitride-oxide semiconductor (MONOS) type. In a nonvolatile semiconductor transistor of the FG TYPE, a charge storage section (floating gate) for retaining charge extends continuously in a plane. Meanwhile, in a nonvolatile semiconductor transistor of the MONOS type, a charge storage section, which may be in the form of charge traps, is disposed discretely in a plane.

More particularly, in a nonvolatile semiconductor transistor of the FG type, a first dielectric film, a floating gate (FG) typically made of polycrystalline silicon, a second dielectric film typically formed from an oxide-nitride-oxide (ONO) film and a control gate are laminated in order on a semiconductor substrate or a well.

Meanwhile, in a nonvolatile semiconductor transistor of the MONOS type, a bottom insulating film, a nitride film ($Si_xN_y$ ($0 \leq x \leq 1$, $0 \leq y \leq 1$)) which takes charge principally of storing charge, a top insulating film and a gate electrode are laminated in order on a semiconductor substrate or a well.

In the MONOS type nonvolatile semiconductor transistor, carrier traps serving as a charge storage section are spatially (that is, in a planar direction and a thicknesswise direction) spread discretely in a nitride film or in the proximity of an interface between a second dielectric film and the nitride film. Therefore, the charge retaining characteristic depends not only upon the film thickness of the bottom insulating film but also upon the energy distribution and the spatial distraction of charge caught by the carrier traps in the nitride film.

If a local leak current path is produced by a defect or the like in the bottom insulating film, then in a FG type memory transistor, most of the stored charge leaks to the substrate side along the leak path, resulting in deterioration of the charge retaining capacity. In contrast, in a MONOS type memory transistor, since the charge storage section is discretized spatially, local storage charge around the leak path merely leaks locally through the leak path. Therefore, the charge retaining characteristic of the entire memory transistor does not deteriorate readily. Therefore, in the MONOS type nonvolatile semiconductor transistor, the problem of deterioration of the charge retaining characteristic by a decrease of the thickness of the bottom insulating film is less serious than that in the case of the FG type memory transistor.

Nonvolatile memory devices are roughly divided into those of a stand alone type and those of a logic circuit incorporating type. A nonvolatile memory device of the stand alone type adopts a nonvolatile memory transistor as a memory element of a memory IC for exclusive use. Meanwhile, in a nonvolatile memory device of the logic circuit incorporating type, a memory block and a logic circuit block are provided as a core of a system-on-chip design, and a nonvolatile memory transistor is used as a memory element for retaining data in a nonvolatile fashion in the memory block.

In most of nonvolatile memory devices of the logic circuit incorporating type, a memory cell of a one-memory transistor type is used.

As a representative one of the one-memory transistor cells of the FG type, the ETOX cell of Intel is known. When ETOX cells are arranged into an array, a memory array system of the common source type wherein the ETOX cells have a common source is adopted.

The one-memory transistor cell of the MONOS type attracts attention in that the cell area can be reduced and the voltage can be reduced readily when compared with that of the FG type. As a representative one of the one-memory transistor cells of the MONOS type, a high-density memory cell of Saifun Semiconductors called NROM is known. Since the NROM cell utilizes discretized carrier traps as a charge storage section, it can store data of 2 bits/cell by injecting charge into two different regions in the cell. When NROM cells are arranged into an array, an impurity diffusion layer is shared by cells adjacent to each other in a row direction, and upon storage or readout of 2-bit data, the function of the impurity diffusion layer is changed over between the source and the drain. Further, a virtual ground array system is used as the high-density memory array system.

In data writing into ETOX cells and NROM cells, channel hot electron (CHE) injection in which a reduction of the voltage can be performed readily when compared with FN tunnel injection is used. In CHE injection writing, an electric field is applied to the source and the drain such that electrons supplied into a channel from the source side are excited in terms of energy in a high electric field region at a drain side end of the channel so as to generate hot electrons. Those of the generated hot electrons which have energy higher than the energy barrier height of the bottom insulating film (where the bottom insulating film is formed from a silicon dioxide film, 3.2 eV) are injected into a charge storage section (floating gate or carrier traps), whereupon the threshold voltage (Vth) increases.

SUMMARY OF THE INVENTION

However, in order to excite electrons until the energy thereof exceeds the energy barrier height which is as high as 3.2 eV upon CHE injection writing of a FG type memory, it is necessary to apply a voltage higher than 10 V to the gate. Although this writing gate voltage is low when compared with that upon FN tunnel writing in which 18 V or more is required, it is considerably higher when compared with a power supply voltage of 2.5 to 5.0 V for a fine CMOS element. The gate application voltage upon CHE injection writing of a MONOS type memory cell is lower than the gate application voltage upon CHE injection writing of a FG type memory cell but is higher than the power supply voltage. For example, in the case of the NROM cell, the gate application voltage necessary upon data writing is 9 V.

Therefore, it is necessary for a boosting circuit in a memory peripheral circuit to boost a power supply voltage to produce a writing gate voltage.

Therefore, it is demanded to provide a nonvolatile semiconductor memory device which is high in charge injection efficiency and which allows a further reduction of the voltage.

According to an embodiment of the present invention, there is provided a nonvolatile semiconductor memory device including a memory transistor. The memory transistor has a channel formation region defined between two source and drain regions formed on a semiconductor substrate, a bottom insulating film, a charge storage film and a top insulating film formed in order at least on the channel formation region, the charge storage film having a charge storage function, and a gate electrode formed on the top insulating film. The bottom insulating film is formed from a plurality of films containing nitrogen such that the content of nitrogen of a lowermost one of the films which contacts with the channel formation region and an uppermost one of the films which contacts with the gate electrode is higher than that of the other one or ones of the films which exist between the uppermost and lowermost films.

Preferably, a barrier energy of the bottom insulating film with respect to silicon is lower than that of silicon oxide with respect to silicon.

According to another embodiment of the present invention, there is provided a nonvolatile semiconductor memory device including a memory transistor. The memory transistor has a channel formation region defined between two source and drain regions formed on a semiconductor substrate, a bottom insulating film, a charge storage film and a top insulating film formed in order at least on the channel formation region, the charge storage film having a charge storage function, and a gate electrode formed on the top insulating film. The bottom insulating film is formed from a film of a single layer containing nitrogen such that the content of nitrogen with respect to silicon in a lowermost layer region of the film which contacts with the channel formation region and an uppermost layer region of the film which contacts with the gate electrode is higher than that of the other film region or regions which exist between the uppermost and lowermost regions.

Preferably, a barrier energy of the bottom insulating film with respect to silicon is lower than that of silicon oxide with respect to silicon.

According to a further embodiment of the present invention, there is provided a nonvolatile semiconductor memory device including a memory transistor. The memory transistor has a channel formation region defined between two source and drain regions formed on a semiconductor substrate, a bottom insulating film, a charge storage film and a top insulating film formed in order at least on the channel formation region, the charge storage film having a charge storage function, and a gate electrode formed on the top insulating film. The bottom insulating film is formed from a plurality of films such that a barrier energy with respect to silicon of a lowermost one of the films which contacts with the channel formation region and an uppermost one of the films which contacts with the gate electrode is lower than that of the other one or ones of the films which exist between the uppermost and lowermost films.

Preferably, the films of the bottom insulating film contain nitrogen such that the content of nitrogen in the lowermost layer region and the uppermost layer region is higher than that of the other film region or regions which exist between the uppermost and lowermost regions.

Preferably, the bottom insulating film is a multilayer film wherein nitrogen oxide films or the composition of a nitrogen oxide film varies in a graded manner.

Preferably, a barrier energy of the bottom insulating film with respect to silicon is lower than that of silicon oxide with respect to silicon.

According to a still further embodiment of the present invention, there is provided a nonvolatile semiconductor memory device including a memory transistor. The memory transistor has a channel formation region defined between two source and drain regions formed on a semiconductor substrate, a bottom insulating film, a charge storage film and a top insulating film formed in order at least on the channel formation region, the charge storage film having a charge storage function, and a gate electrode formed on the top insulating film. The bottom insulating film is formed from a film of a single layer such that a barrier energy with respect to silicon of a lowermost layer region of the film which contacts with the channel formation region and an uppermost layer region of the film which contacts with the gate electrode is lower than that of the other film region or regions which exist between the uppermost and lowermost regions.

Preferably, the single layer film of the bottom insulating film contains nitrogen such that the content of nitrogen in the lowermost layer region and the uppermost layer region is higher than that of the other film region or regions which exist between the uppermost and lowermost regions.

Preferably, the bottom insulating film is a single layer film wherein nitrogen oxide films or the composition of a nitrogen oxide film varies in a graded manner.

Preferably, the barrier energy of the bottom insulating film with respect to silicon is lower than that of silicon oxide with respect to silicon.

According to a yet further embodiment of the present invention, there is provided a fabrication method for a nonvolatile semiconductor memory device which includes a channel formation region defined between two source and drain regions formed on a semiconductor substrate, a bottom insulating film, a charge storage film and a top insulating film formed in order at least on the channel formation region, the charge storage film having a charge storage function, and a gate electrode formed on the top insulating film. The method includes a step of forming the bottom insulating film such that the content of nitrogen is higher at an interface side portion of the bottom insulating film with the channel formation region and another interface side portion of the bottom insulating film with the charge storage film than at a central portion of the bottom insulating film between the two interface side portions in the film thicknesswise direction.

Preferably, upon the formation of the bottom insulating film, a plasma nitriding technique or a plasma nitriding technique and a later high temperature annealing technique are used in order to raise the nitrogen concentration at the two interface side portions when compared with that at the central portion in the film thicknesswise direction.

In summary, according to the present invention, a nonvolatile semiconductor memory device can be provided which exhibits a high charge injection efficiency and a good data retaining characteristic and which allows a reduction of the voltage.

The above and other features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 13 is a table illustrating the nitrogen peak concentration and the depth of specimens fabricated in various film formation conditions;

DETAILED DESCRIPTION OF THE PREFERRED EMBODIMENT

In the following, a preferred embodiment of the present invention is described wherein the present invention is applied to a nonvolatile memory device which uses a MONOS type memory transistor.

<<General Configuration>>

The nonvolatile memory device according to the present embodiment includes a memory block and a logic circuit block.

Figure 1:
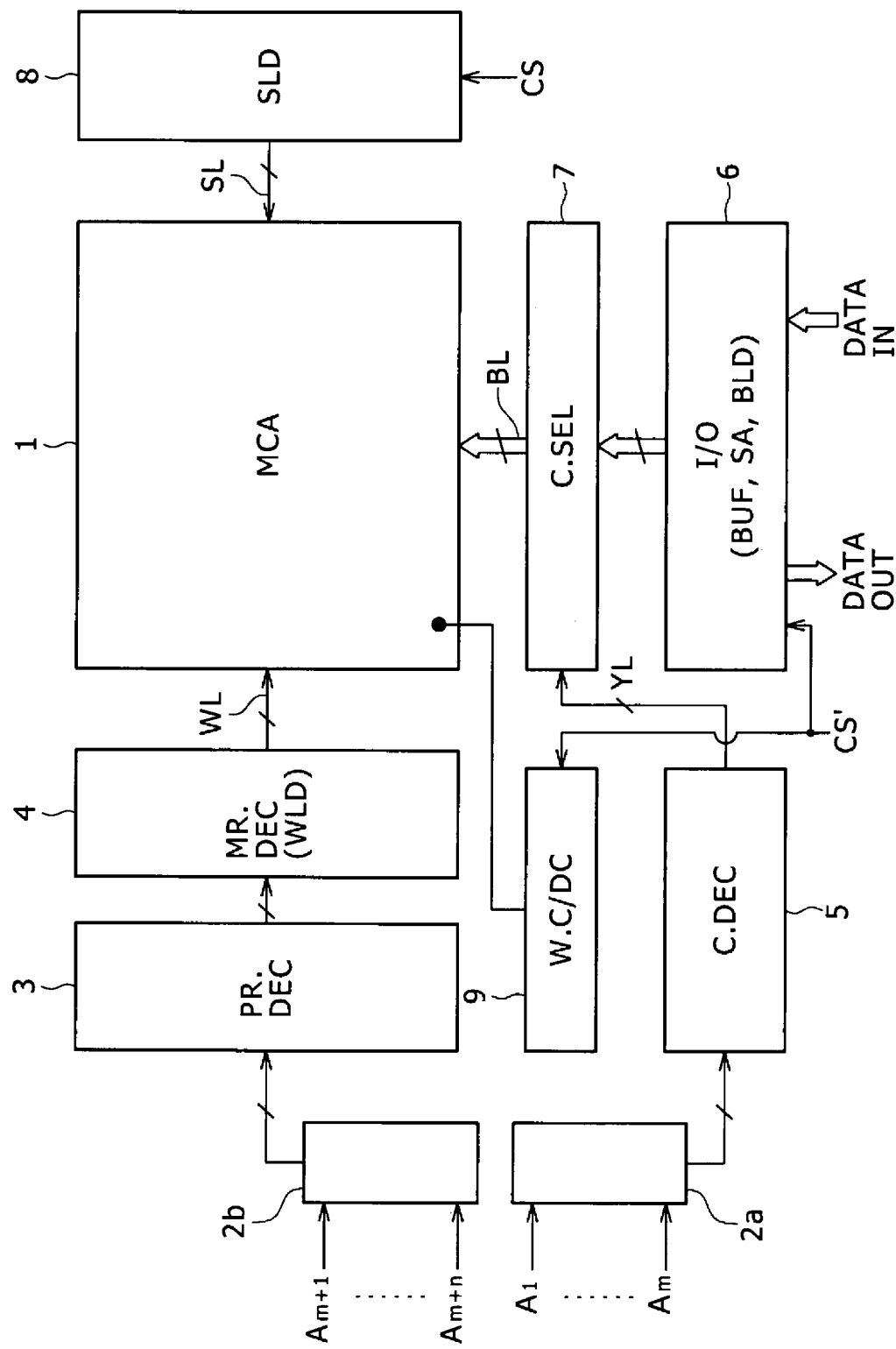
FIG. 1 is a block diagram of a nonvolatile semiconductor memory device to which the present invention is applied.

FIG. 1 shows a general configuration of the memory block.

Referring to FIG. 1, the memory block shown includes a memory cell array (MCA) 1 and memory peripheral circuits for controlling operation of the memory cell array 1. The memory peripheral circuits can output at least ±4 V as a maximum voltage.

The memory peripheral circuits include a column buffer 2a, a row buffer 2b, a pre-row decoder (PR.DEC) 3, a main row decoder (MR.DEC) 4, a column decoder (C.DEC) 5, an input/output circuit (I/O) 6, a column gate array (C.SEL) 7, a source line driving circuit (SLD) 8 and a well charge/discharge circuit (W.C/DC) 9. Though not particularly shown, the memory peripheral circuits further include a power supply circuit for boosting a power supply voltage a little and supplying the boosted voltage to the main row decoder 4, a source line driving circuit 8 and a well charge/discharge circuit 9 as occasion demands, and a control circuit for controlling the power supply. It is to be noted that, although such boosting as described above is required where the power supply voltage supplied from the outside is 2.5 V or less, where the power supply voltage is 2.5 V, no boosting is required.

The main row decoder 4 includes a word line driving circuit WLD for applying a predetermined voltage to one of the word lines designated by the pre-row decoder 3.

The input/output circuit 6 includes a buffer BUF for a program and readout data, a bit line driving circuit BLD for applying a predetermined voltage to a bit line BL upon writing, erasure or the like, and a sense amplifier SA.

The memory peripheral circuits have, for example, the following functions in regard to writing and erasure.

First, when a chip enable signal (not shown) is in the "high (H)" state, address signals A1 to Am+n inputted to address terminals are inputted to the pre-row decoder 3 and the column decoder 5 through the address buffers (column buffer 2a and row buffer 2b).

Part of the inputted address signals is decoded by the pre-row decoder 3, and a predetermined word line WL designated by the address signals is selected. Then, a predetermined voltage is applied from the word line driving circuit (WLD), and a predetermined voltage is applied to the selected word line WLsel. from the word line driving circuit WLD in the main row decoder 4.

Upon writing, a positive voltage of a high level such as, for example, 3.5 V is applied from the word line driving circuit WLD to the selected word line WLsel. while the other unselected word lines WLsel. are kept, for example, at 0 V.

The remaining part of the address signals is decoded by the column decoder 5, and a column selection line YL designated by the decoded address signal is selected. Then, a predetermined voltage is applied to the selected column selection line YL.

When the predetermined voltage is applied to the column selection line YL, a predetermined bit line selection transistor in the column gate array 7 is placed into a conducting state, and a bit line BLsel. selected by the bit line selection transistor is connected to the input/output circuit 6.

Upon writing, the source line driving circuit 8 is controlled by a control signal CS to apply the ground potential GND to a source line SL.

On the other hand, the well charge/discharge circuit 9 is controlled by another control signal CS' to charge the memory cell array to a predetermined reverse bias voltage (for example, a negative voltage) only upon writing.

Consequently, upon writing, write data in the input/output buffer is applied to the selected bit line BLsel. and written into a memory cell positioned at an intersecting point of the selected bit line BLsel. and the excited selected word line WLsel. More particularly, a positive voltage of approximately 3.5 V or 0 V is applied to the selected bit line BLsel. in response to the write data, and hot electrons produced by ionizing collision (for example, secondary ionizing collision) are injected into the memory cell to which the voltage mentioned is applied.

As hereinafter described, where a well is divided into parallel stripes elongated in the bit line direction, in the configuration shown in FIG. 1, well selection may be performed based on a column address. Upon writing by hot electron injection by secondary ionizing collision, a well is preferably biased to the negative polarity. In this instance, for example, approximately −1.0 to −3.5 V is applied to the selected well.

<<Memory Cell Array>>

Figure 2:
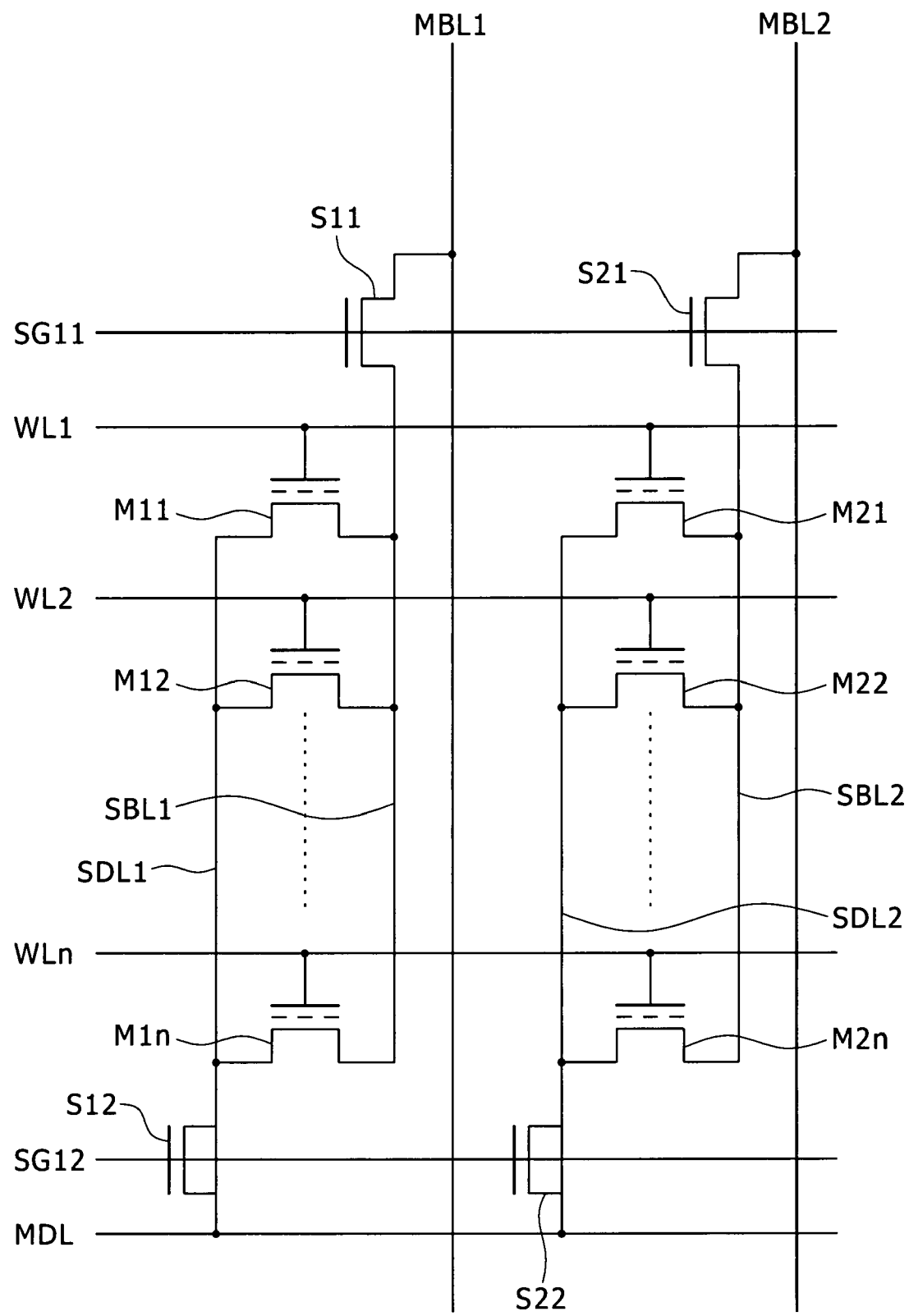
FIG. 2 is a circuit diagram showing a basic configuration of a memory cell array of the nonvolatile semiconductor memory device.

FIG. 2 shows an example of a circuit configuration of the memory cell array (MCA) 1. The array configuration has hierarchical bit lines and source lines and is called SSL (Separated Source Line) type.

Figure 3:
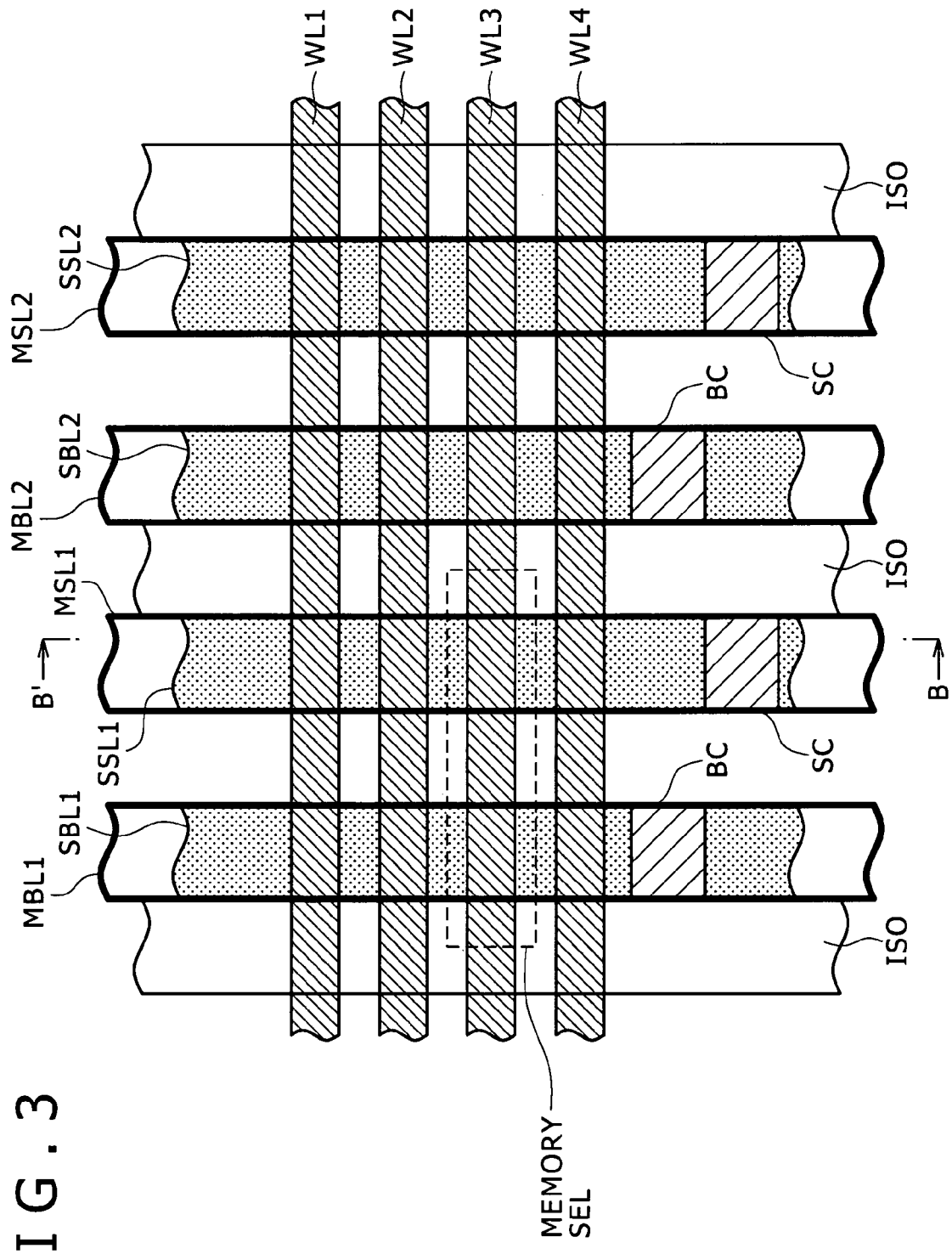
FIG. 3 is a partial schematic plan view of the memory cell array.

FIG. 3 is a plan view of the memory cell array.

Figure 4:
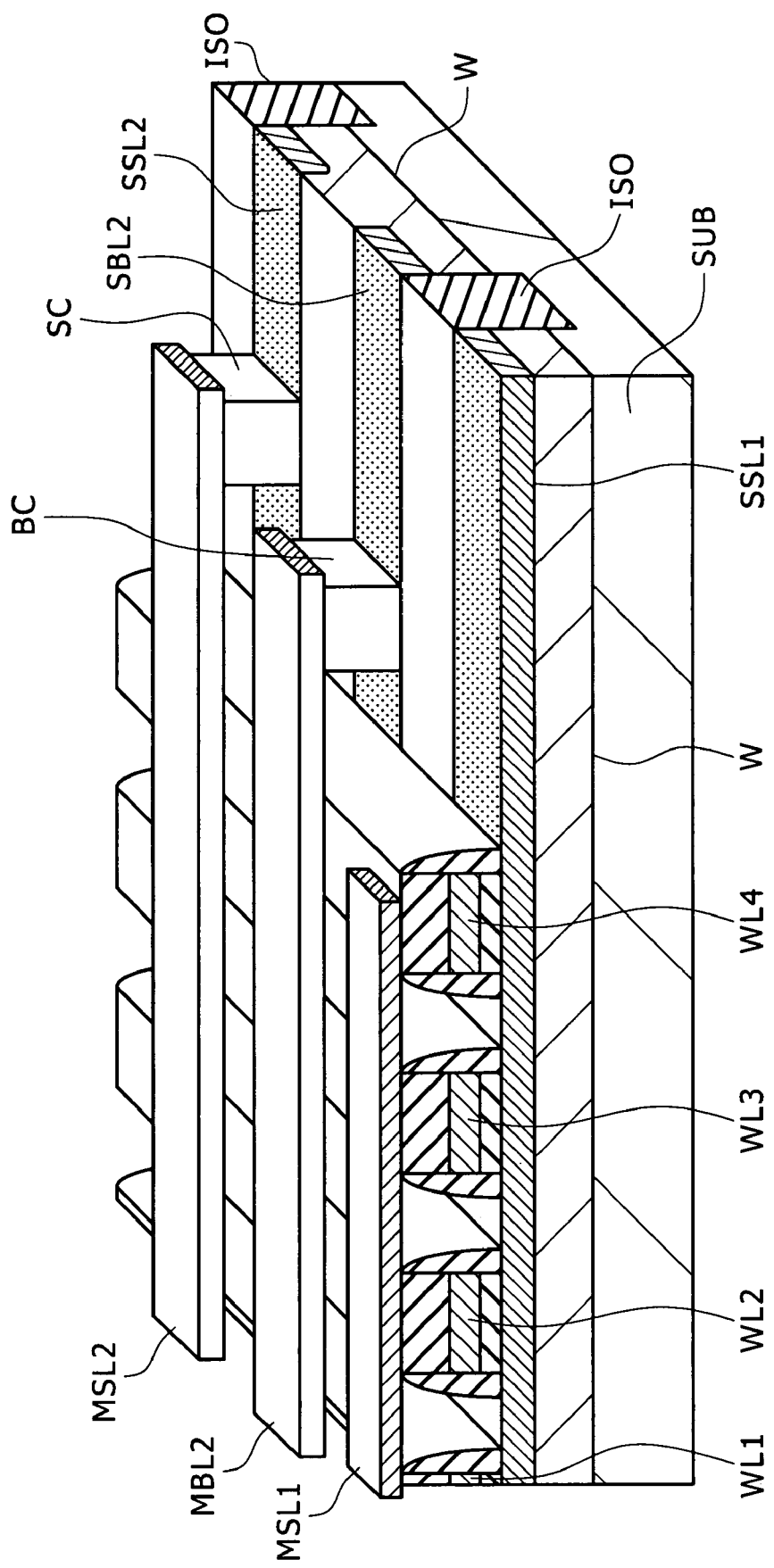
FIG. 4 is a schematic perspective view of the memory cell array as viewed from a cross section taken along line 3-3' of FIG. 3.

FIG. 4 is a perspective view of the memory cell array as viewed from the side of a cross section taken along B-B' of FIG. 3.

In the memory cell array, a bit line is hierarchized into a main bit line and a sub bit line, and a source line is hierarchized into a main source line and a sub source line.

Referring to FIG. 2, a sub bit line SBL1 is connected to a main bit line MBL1 through a select transistor S11, and another sub bit line SBL2 is connected to another main bit line MBL2 through another select transistor S21. Further, a sub source line SSL1 is connected to a main source line MSL1 through a select transistor S12, and another sub source line SSL2 is connected to another main source line MSL2 through another select transistor S22.

A plurality of memory transistors M11 to M1n (for example, n=64) are connected in parallel between the sub bit line SBL1 and the sub source line SSL1, and another plurality of memory transistors M21 to M2n are connected in parallel between the sub bit line SBL2 and the sub source line SSL2. The n memory transistors connected in parallel and the two select transistors (S11 and S12 or S21 and S22) form a block of a unit which forms the memory cell array.

The memory transistors M11, M21, . . . which are positioned adjacent to each other in a word direction are connected at the gate thereof to a word line WL1. Similarly, the memory transistors M12, M22, . . . are connected at the gate thereof to another word line WL2, and the memory transistors M1n, M2n, . . . are connected at the gate thereof to the word line WLn.

The select transistors S11 and S21 which are positioned adjacent each other in the word direction are controlled through a select gate line SG11, and the select transistors S12 and S22 are controlled through another select gate line SG12.

In the memory cell array, P wells W are formed on the surface of a semiconductor substrate SUB, as seen in FIG. 4. The P wells W are separated and isolated in the row direction by an element isolating insulating layer ISO having a shape of a parallel stripe pattern. It is to be noted that it is also possible to adopt a well-in-well (WIW) structure that is hereinafter described.

Each of the P well portions isolated by the element isolating insulating layer ISO serves as an active region of a memory transistor. On the opposite sides of the active region in the widthwise direction, an N-type impurity is introduced in a high concentration into the parallel stripe well portions spaced away from each other. Consequently, sub bit lines SBL1 and SBL2 (hereinafter referred to simply as SBL) as second source-drain regions and sub source lines SSL1 and SSL2 (hereinafter referred to simply as SSL) as first source-drain regions are formed.

A dielectric film (charge storage film) is formed on the sub bit lines SBL and the sub source lines SSL and has a shape of a pattern of parallel stripes perpendicular to sub bit lines SBL and the sub source lines SSL. The dielectric film includes a charge storage section in the inside thereof. The word lines WL1, WL2, WL3, WL4, . . . (hereinafter referred to simply as WL), which serve also as gate electrodes, are formed on the charge storage film.

Of the P well portions between the sub bit lines SBL and the sub source lines SSL, those portions which intersect with the word lines WL are memory transistor channel formation regions. A portion of a sub bit line (second source-drain region) which that is contiguous to a channel formation region functions as the drain, and a portion of a sub source line (first source-drain region) which is contiguous to a channel formation region functions as the source.

The top face and the side walls of each word line WL are covered with an offset insulating layer and a side wall insulating layer (in the example shown, an ordinary interlayer insulating layer may be used).

The insulating layers mentioned have bit contact plugs BC formed at predetermined distances thereon and extending to the corresponding sub bit line SBL and source contact plugs SC formed at predetermined distances thereon and extending to the corresponding sub source line SSL. The contact plugs BC and SC are conducting members, for example, plugs, made of, for example, polycrystalline silicon or high-melting point metal and are provided, for example, for every 64 memory transistors in the bit direction.

On the insulating layers, main bit lines MBL1, MBL2, . . . (hereinafter referred to simply as MBL) contacting with the bit contact plugs BC and main source lines MSL1 MSL2, . . . (hereinafter referred to simply as MSL) contacting with the source contact plugs SC are formed alternately. The main bit lines and the main source lines have a pattern shape of parallel stripes elongated in a column direction.

In the memory cell array shown, the bit lines and the source lines are hierarchized, and there is no necessity to form a bit contact plug BC and a source contact plug SC for each memory cell. Accordingly, basically, the contact resistance exhibits no dispersion among the cells. A bit contact plug BC and a source contact plug SC are provided, for example, for every 64 memory cells. Where formation of the bit contact plugs BC and the source contact plugs SC is not performed in a self-matching manner, the offset insulating layer and the side wall insulating layer are not required. In this instance, an ordinary interlayer insulating film is deposited thickly and memory transistors are embedded in the interlayer insulating film, and then ordinary photolithography and etching are performed to perforate contact holes and conducting material is filled into the contact holes.

Thus, a pseudo contactless structure is formed wherein the sub bit lines SBL (second source-drain regions) and the sub source lines SSL (first source-drain regions) are formed from impurity regions.

Therefore, since little wasteful space exists, where the layers are formed with a minimum dimension F of a wafer process-limit, a very small cell area very proximate to $8 F^2$ can be implemented.

The bit lines and the source lines are hierarchized, and parallel memory transistors in an unselected unit block are disconnected from the main bit line MBL by the select transistor S11 or S21. Therefore, the volume of the main bit line MBL is reduced significantly, which is advantageous in speeding up and a reduction in power consumption. The sub source line SSL can be disconnected from the main source line MSL by action of the select transistor S12 or S22, thereby decreasing the volume thereof.

For further speeding up, the sub bit lines SBL and the sub source lines SSL may be formed from impurity regions to which silicide is adhered while the main bit lines MBL and the main source lines MSL are formed by metal wiring.

Now, the structure of the memory cell array of the SSL (Separated Source Line) type is described.

Figure 5:
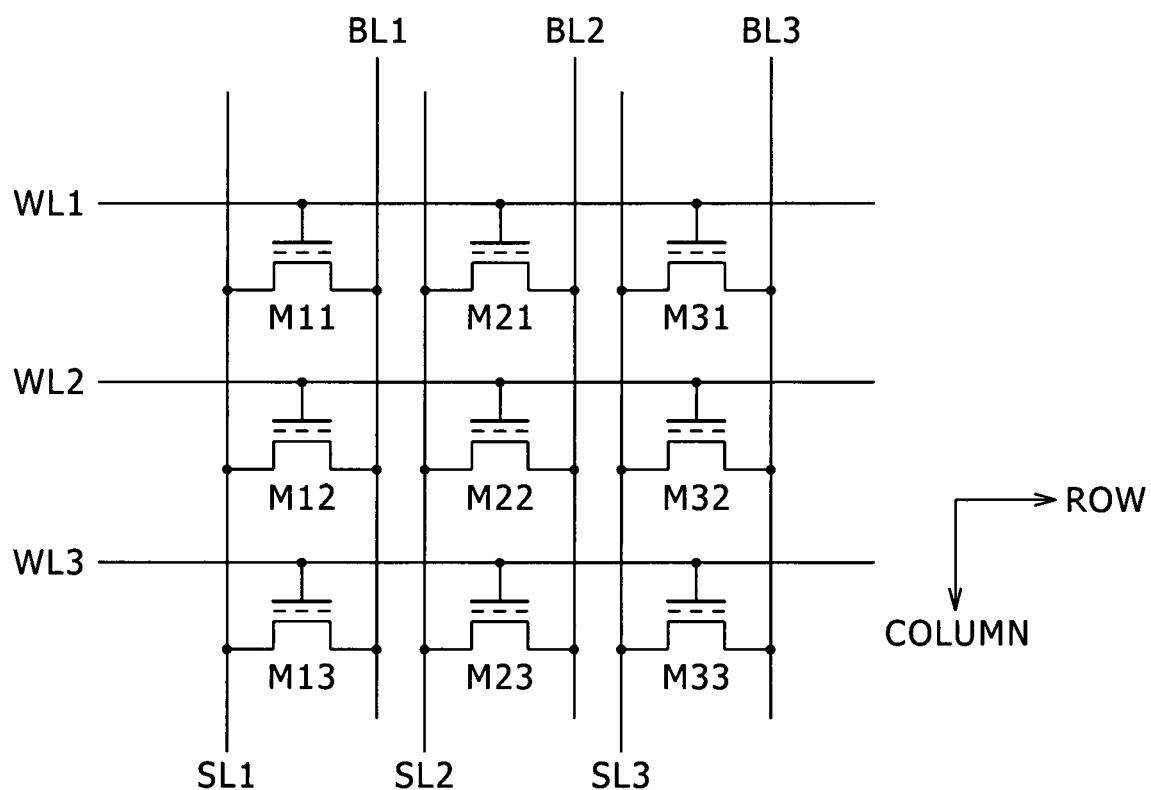
FIG. 5 is an equivalent circuit diagram of a NOR type memory cell array.
Figure 6:
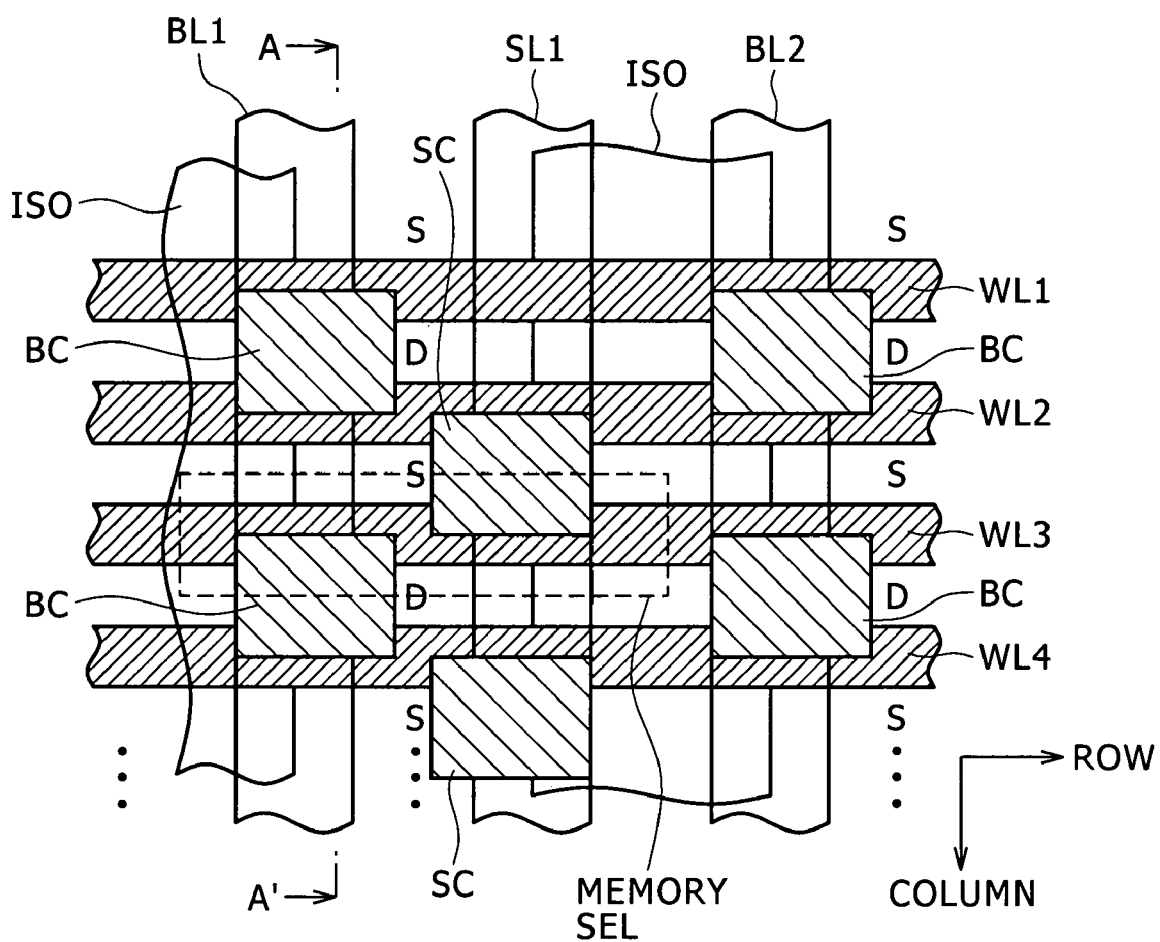
FIG. 6 is a partial schematic plan view of the NOR type memory cell array.
Figure 7:
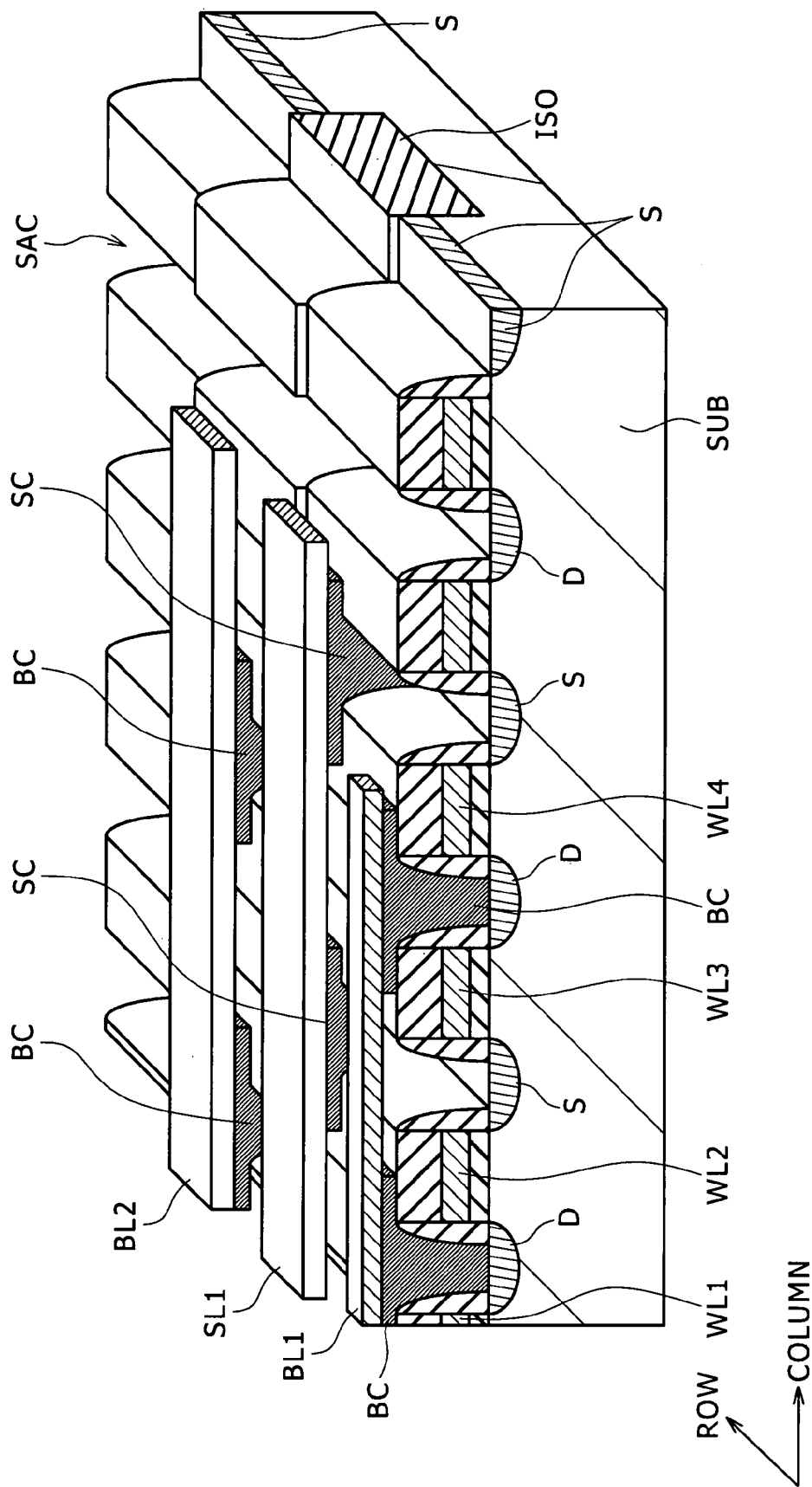
FIG. 7 is a schematic perspective view of the NOR type memory cell array as viewed from a cross section taken along line A-A' of FIG. 6.

FIG. 5 shows an equivalent circuit of the memory cell array, and FIG. 6 shows in a schematic top plan a fine cell array which can be formed using a self-matching technique. FIG. 7 shows a cross section taken along line A-A' of FIG. 6.

In the memory cell array of the present example, each memory cell is formed from a single memory transistor. As seen in FIG. 5, the memory transistors M11 to M33, each of which forms a memory cell, are disposed in a matrix, and the memory transistors M11 to M33 are connected by word lines WL1 to WL3, bit lines BL1 to BL3 and (isolating) source lines SL1 to SL3.

The memory transistors M11, M12 and M13 disposed along a column direction are connected at the source thereof to the bit line BL1 and at the drain thereof to the source line SL1. The memory transistors M21, M22 and M23 disposed along a column direction are connected at the source thereof to the bit line BL2 and at the drain thereof to the source line SL2. The memory transistors M31, M32 and M33 disposed along a column direction are connected at the source thereof to the bit line BL3 and at the drain thereof to the source line SL3.

The memory transistors M11, M21 and M31 disposed along a row direction are connected at the gate thereof to the word line WL1. The memory transistors M12, M22 and M32 disposed along a row direction are connected at the gate thereof to the word line WL2. The memory transistors M13, M23 and M33 disposed along a row direction are connected at the gate thereof to the word line WL3.

In the entire memory cell array, the cell arrangement and the cell connection are repeated similarly.

Where the memory cell array is compared with the memory cell array shown in FIG. 2, it does not require the select transistors S11, S12, S21 and S22.

In addition to the fact that the select transistors are not required, since the source lines and the bit lines are not hierarchized, the memory cell array has a reduced area when compared with the memory cell array shown in FIG. 2. Therefore, the memory cell array of the present example is advantageous in that the substantial cell area per one bit can be reduced, particularly in a memory whose integration scale is middle or small.

Referring to FIG. 7, in the memory cell array, the element isolating insulating layer ISO formed from insulating trenches or LOCOS is formed in the surface region of a P-type semiconductor substrate SUB (or P-well). The element isolating insulating layer ISO has the shape of parallel lines elongated in a column direction, as seen in FIG. 6. The word lines WL1, WL2, WL3 and WL4 are formed at equal distances and extend substantially perpendicularly to the element isolating insulating layer ISO.

As seen in FIG. 7, a laminated insulating film and the word lines WL1 to WL4 (hereinafter referred to as word lines WL) are laminated on the semiconductor substrate SUB with the laminated insulating film being sandwiched between the word lines WL1, WL2, WL3 and WL4 and the active region of the semiconductor substrate SUB.

Referring to FIGS. 6 and 7, source regions S and drain regions D in which an N-type impurity is contained at a high concentration are formed alternately along a column direction on the surface portion of the active regions which are defined by the element isolating insulating layer ISO. The dimension of the source regions S and the drain regions D in a row direction is defined by the distance of different portions of the element isolating insulating layer ISO. The dimension of the source regions S and the drain regions D in a column direction is defined by the distance of the word lines WL1 to WL4. The dimension of the source regions S and the drain regions D in a column direction is defined by the distance between the word lines WL1 to WL4. The source regions S and the drain regions D are formed very uniformly because an error in mask adjustment is introduced little therein with regard to the dispersion in dimension and arrangement.

Referring to FIG. 7, a top portion and side walls of the word lines WL1 to WL4 are covered with an insulating layer. An offset insulating layer having a pattern the same as that of the word lines WL1, WL2, is formed on the word lines WL1, WL2, . . . .

A side wall spacer is formed on the opposite side walls of a lamination pattern formed from the offset insulating layer, underlying gate electrodes (word lines) and a laminated insulating film.

An elongated, self-aligning contact portion SAC is opened along and between two adjacent word lines. In the self-aligning contact portion SAC, the word lines are covered with the offset insulating layer and the sidewall spaces.

A conductive material is filled alternately in the self-aligning contact portion SAC in a partly overlapping relationship with the source region S or the drain region D so as to form a bit contact plug BC and a source contact plug SC. The bit contact plug BC overlaps with one end portion of the source region S in a row direction. The source contact plugs SC overlaps with the other end portion of drain region D in a row direction. As a result, the bit contact plugs BC and the source contact plugs SC are formed alternately as seen in FIG. 6.

A recessed portion around each contact plug is filled up with an insulating film (not shown). The bit lines BL1, BL2, . . . which contact with the bit contact plugs BC and the source lines SL1, SL2, . . . which contact with the source contact plugs SC are formed alternately on the insulating film. The bit lines BL1, BL2, . . . and the source lines SL1, SL2, . . . have a shape of parallel lines elongated in a column direction.

<<Memory Transistor: Outline>>

In the following, a memory transistor structure is described taking an SSL type memory cell as an example.

Figure 8:
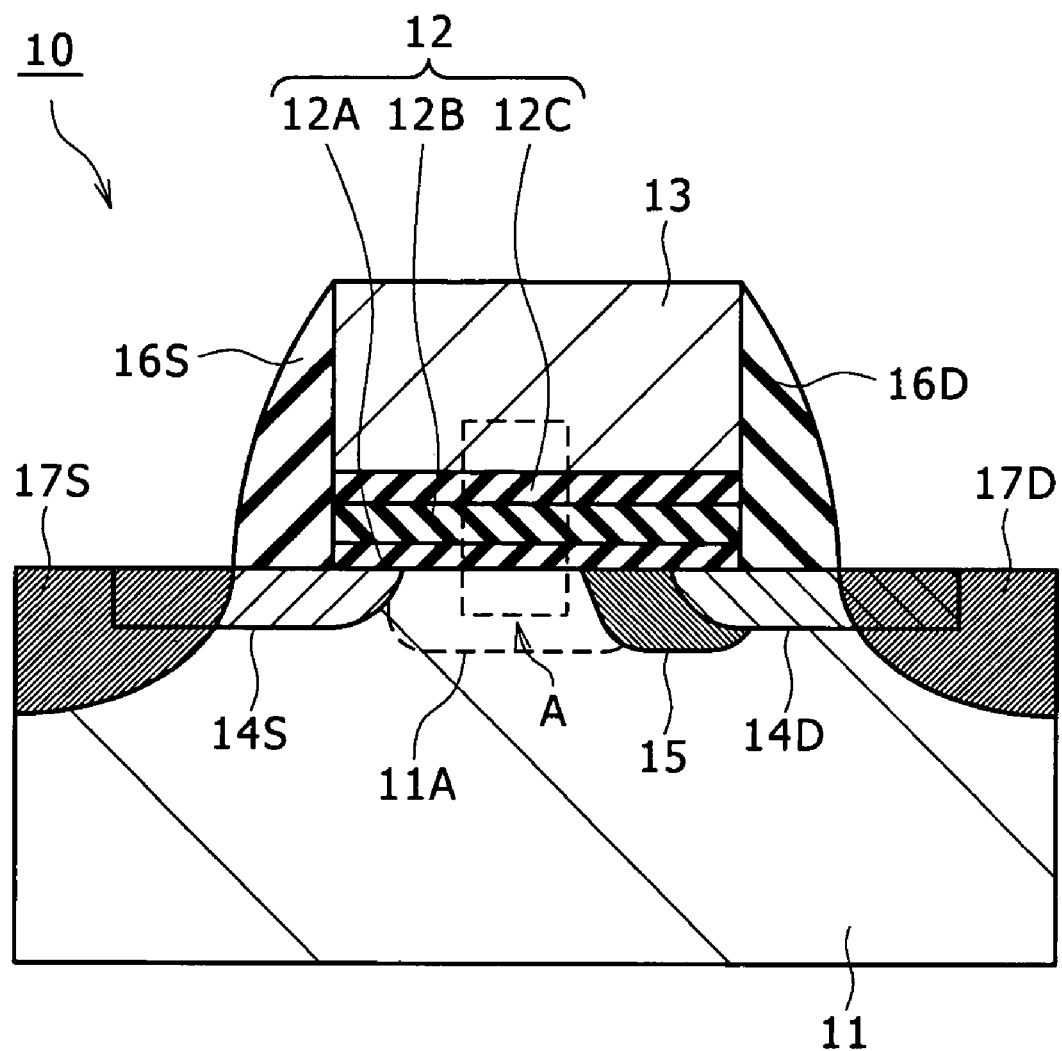
FIG. 8 is a schematic cross sectional view of a MONOS type memory transistor.

FIG. 8 shows an enlarged cross section of a memory transistor in a row direction (hereinafter referred to as channel direction).

In the memory transistor 10 shown in FIG. 8, a semiconductor substrate (or P well) 11 made of a P-type semiconductor has a semiconductor region in which a channel is formed, that is, an active region 11A. The active region 11A may have a form of a portion of a P-type semiconductor substrate, a P well formed on a semiconductor substrate through another well as occasion demands, or a P-type semiconductor layer (for example, a SOI (Silicon-On-Insulator) layer) supported on a substrate (which may be formed from a material other than a semiconductor material). In the following, the term of the semiconductor substrate 11 or the active region 11A is used to include, in addition to a silicon wafer, a well or a SOI layer formed on the substrate, or a region of part of such well or SOI layer.

The active region 11A is hereinafter referred to as channel formation region 11A.

A laminated insulating film 12 is formed on the surface of the channel formation region 11A and includes a bottom insulating film 12A, a charge storage film 12B serving as a charge retaining layer, and a top insulating film 12C. A gate electrode 13 is formed on the laminated insulating film 12.

Two N-type LDD (Lightly Doped Drain) regions 14S and 14D are formed in a spaced relationship from each other in the channel formation region 11A in such a manner as to partly overlap with the gate electrode 13. Further, a P-type high-concentration channel region 15 is formed so as to extend from a location in the proximity of an end portion of the LLD region 14D on the drain side toward the source side. The high-concentration channel region 15 is formed by injection of a P-type impurity, for example, by oblique ion implantation. The ion implantation dose at this time is optimized so that the P-type impurity concentration of the high-concentration channel region 15 may finally be higher by a required amount than the P-type impurity concentration of the channel formation region 11A. Where such a high-concentration channel region 15 as described above exists, since the P-type impurity concentration is locally raised in the proximity of the drain side end portion of the LLD region 14D, upon application of an operation voltage, elongation of a depletion layer is suppressed at the portion. As a result, the concentration of a horizontal electric field enhances.

Since this contributes to enhancement of the charge injection efficiency, formation of the high-concentration channel region 15 is preferable. However, in the present embodiment, it is not an essentially required condition to provide the high-concentration channel region 15, and therefore it is possible to omit the high-concentration channel region 15.

The laminated insulating film 12 is formed on the channel formation region 11A including the high-concentration channel region 15. The gate electrode (word line WL) of the memory transistor is formed on the laminated insulating film 12. The word line WL is formed from doped polycrystalline silicon in which a P- or N-type impurity is contained in a high concentration so as to provide conductivity thereto, high-melting point silicide, or a laminated film of doped polycrystalline silicon and high-melting point metal silicide. The length of a valid portion of the word line WL, that is, a portion of the word line WL corresponding to the distance between the source and the drain, that is, the gate length, is less than 0.18 μm, for example, approximately 130 nm.

Spacers (sidewall spacers) 16S and 16D made of an insulating substance are formed on the opposite side walls of the gate electrode 13. A source region 17S formed from an N-type impurity region and corresponding to the source region S of FIGS. 6 and 7 is formed at a portion on the surface side of the channel formation region 11A whose position is defined by the spacer 16S. Similarly, a drain region 17D formed from an N-type impurity region and corresponding to the drain region D of FIGS. 6 and 7 is formed at a portion on the surface side of the channel formation region 11A whose position is defined by the spacer 16D.

The source region 17S and the drain region 17D are formed by ion implantation of an N-type impurity in a comparatively high concentration. At this time, the spacers 16S and 16D and the gate electrode 13 function as a self-aligning mask to define the position of the source region 17S and the drain region 17D. Further, the LDD regions 14S and 14D are formed by ion implantation of an N-type impurity before the spacers 16S and 16D are formed, and the concentration thereof is normally set lower than that of the source region 17S or the drain region 17D. Further, the patterns of the LDD regions 14S and 14D overlap with end portions of the pattern of the gate electrode 13. This is because it is intended to allow the electric field of the gate to extend to the drain readily, thereby making it possible to produce holes with a low drain voltage.

It is to be noted that, in order to let the electric field of the gate extend to the drain readily, it is only necessary for the LLD region 14D to extend from the drain region 17D to a location immediately below an end portion of the gate electrode, and in this regard, the LLD region 14D may be referred to as an "extension region", which does not suggest a relationship in magnitude of the concentration. In this case, there is no necessity for the N-type impurity concentration in the extension region to be lower than the N-type impurity concentration in the drain region 17D.

To the source region 17S, drain region 17D, gate electrode 13 and channel formation region 11A, voltages Vs (source voltage), Vd (drain voltage), Vg (gate voltage) and Vb (back bias voltage) (which is applied as occasion demands) suitable for operation can be applied through respective contact portions and wiring lines (not shown).

The charge storage film 12B is made of a material having a higher charge trap density than those of the bottom and top insulating films 12A and 12C and functions as a charge retaining layer upon charge injection. The charge storage film 12B in the present embodiment is formed from a silicon nitride ($Si_xN_y$ ($0 \leq x \leq 1$, $0 \leq y \leq 1$)) film of, for example, 5.0 nm thick. The charge storage film 12B is fabricated, for example, by low pressure CVD (LP-CVD) and includes many carrier traps therein. The charge storage film 12B exhibits an electric conduction characteristic of the Pool-Frankel type (PF type).

The bottom and top insulating films 12A and 12C have a role of electrically isolating the charge storage film 12B from the channel formation region 11A and the gate electrode 13, respectively, to entrap charge in the charge storage film 12B in order to retain the charge.

The bottom and top insulating films 12A and 12C are formed from a silicon nitride film, an oxynitride film or a like film if the film has a sufficient charge track density difference with respect to the charge storage film 12B and functions as a potential barrier. However, as hereinafter described, the bottom insulating film 12A is formed from a multilayer film.

The top insulating film 12C is formed, for example, from a high temperature CVD oxide film (HTO). Where the top insulating film 12C is formed by CVD, this trap is formed by heat processing.

It is necessary for the top insulating film 12C to have a film thickness of at least 3.5 nm, preferably of 5 nm or more, in order to prevent injection of holes from the gate electrode 13 (for example, the word line WL) to achieve prevention of a decrease of the number of times by which rewriting of data is permitted. More preferably, the film thickness of the top insulating film 12C can be determined within a range from 4 nm to 9.0 nm, and here it is determined within a range from 5 nm to 7 nm.

Further, the top insulating film 12C may be formed by thermal oxidation after formation of the charge storage film 12B.

<<Bottom Insulating Film>>

In the present embodiment, the bottom insulating film 12A is formed from a plurality of films laminated one on another. The film thickness of the bottom insulating film 12A can be determined within a range from 2.0 nm to 10.0 nm in accordance with an application and is set here to 7 nm.

The bottom insulating film 12A includes, as a principal film of the multilayer film, an insulating film whose barrier height with respect to the channel formation region 11A is lower than the magnitude (barrier height) of the barrier energy between silicon oxide ($SiO_2$) and silicon (Si) such as, for example, an oxynitride (SiON) film.

Further, even with silicon oxide, the barrier height between the bottom insulating film 12A and the channel formation region 11A can be made lower than that between silicon oxide ($SiO_2$) and silicon (Si) by performing plasma nitriding processing for the bottom insulating film 12A.

Furthermore, both the selection of a film material, such as silicon oxynitride (SiON) or the like, and application of the plasma nitriding processing may be performed.

In the plasma nitriding processing, for example, after an oxide film is formed, it is nitrided at 650° C. in short time. In particular, as the plasma nitriding processing, plasma processing conditions of, for example, 650° C., 60 sec., $N_2$ gas and 250 W are preferable. By the nitriding processing, at least part of the oxide film changes into an oxynitride film. The processing conditions can control the content of N through the RF power and the film formation temperature. As a result, the energy barrier as viewed from the Si substrate can be reduced in both the conduction band and the valence band.

In the following description, a case wherein plasma nitriding processing is performed to reduce the barrier height is described as an example.

Figure 9A:
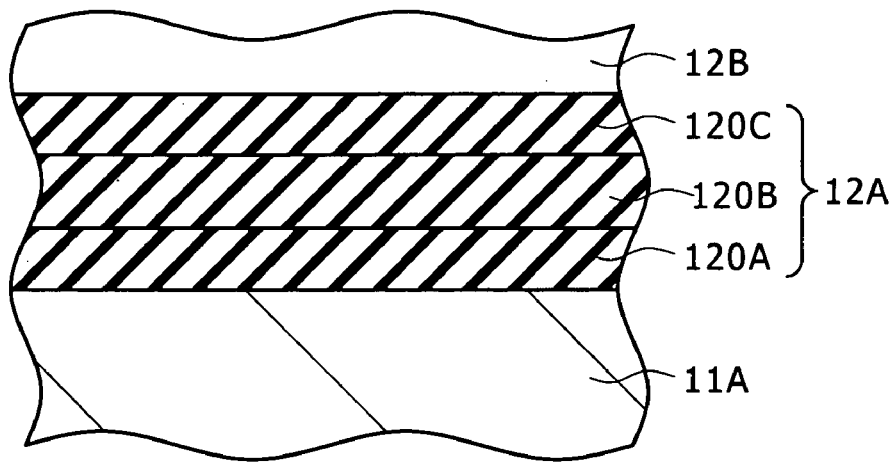
FIG. 9A is a cross sectional view showing a film structure of a bottom insulating film.
Figure 9B:
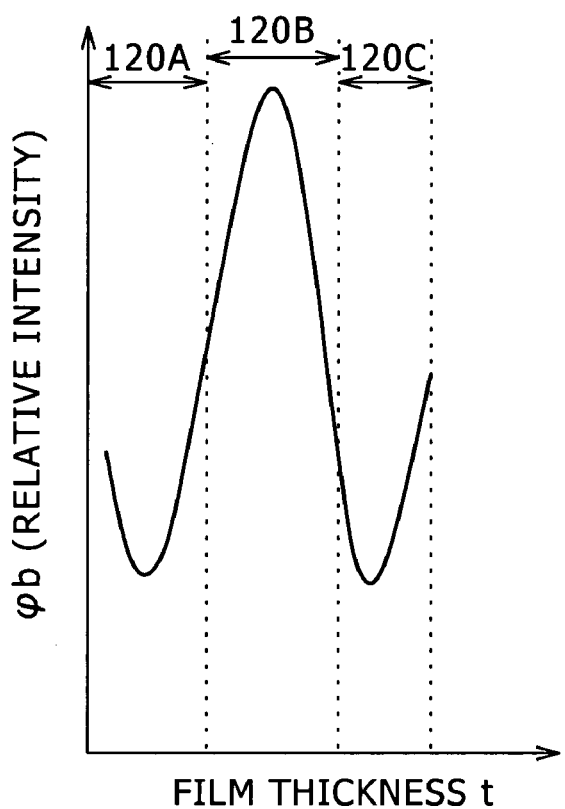
FIG. 9B is a diagram illustrating the relative intensity of the barrier energy of the bottom insulating film in a film thicknesswise direction.

FIG. 9A shows a film structure where the bottom insulating film 12A is formed from three SiON films as an example. Meanwhile, FIG. 9B illustrates the relative intensity of Si of the barrier energy Φb of the bottom insulating film 12A.

In the present embodiment, the bottom insulating film 12A is suitably formed from the oxynitride films 120A, 120B and 120C in order from the channel formation region 11A side. In this instance, the barrier energy Φb of Si with respect to the middle oxynitride film 120B is higher than those in the other two oxynitride films 120A and 120C.

Where the characteristics described above are generalized, in the present embodiment, the bottom insulating film 12A is formed from a plurality of films, and the lowermost layer (120A) which contacts with the channel formation region and the uppermost layer (120C) which contacts with the charge storage film 12B from among the films of the bottom insulating film 12A have barrier energy with respect to silicon lower than the barrier energy of any other film (120B where the bottom insulating film 12A has three layers) which exists between the uppermost layer (120C) and the lowermost layer (120A) with respect to silicon.

If this requirement is satisfied, then the uppermost layer (120C) and the lowermost layer (120A) may have any relationship in barrier energy therebetween and the other films existing between the uppermost layer (120C) and the lowermost layer (120A) also may have any relationship in barrier energy therebetween.

Figure 10A:
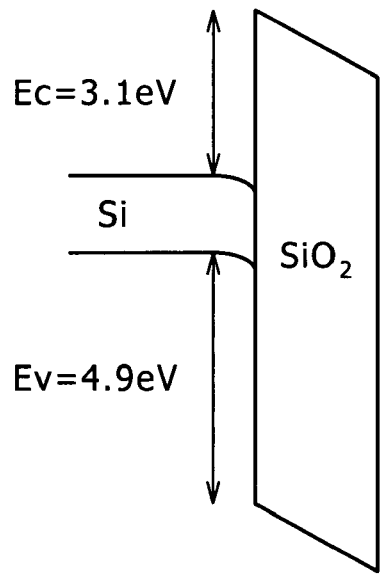
FIGS. 10A, 10B and 10C are schematic views illustrating the energy band representing the barrier energy of a $SiO_2$ film, a $Si_3N_4$ film and a SiON film with respect to Si, respectively.
Figure 10B:
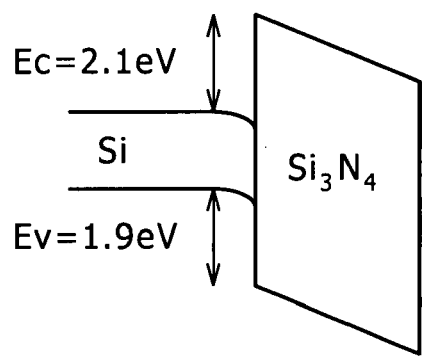
Figure 10C:
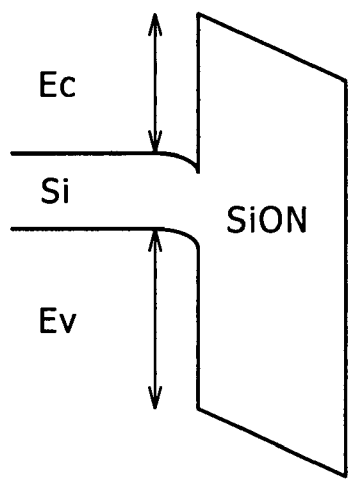

FIGS. 10A, 10B and 10C illustrate the barrier energy of a $SiO_2$ film, a $Si_3N_4$ film and a SiON film with respect to silicon (Si) for comparison between barrier energy Ec with respect to electrons in the conduction band and barrier energy Ev with respect to holes in the valence band.

The barrier energy Ec, barrier energy Ev and energy gap Eg of $SiO_2$ with respect to silicon are 3.1 eV, 4.9 eV and 9.1 eV, respectively. Meanwhile, the barrier energy Ec, barrier energy Ev and energy gap Eg of $Si_3N_4$ with respect to silicon are 2.1 eV, 1.9 eV and 5.1 eV, respectively.

On the other hand, it is estimated that the barrier energy Ec and Ev of SiON with respect to silicon has values between those of $SiO_2$ and $Si_3N_4$ and decreases as the nitrogen concentration increases.

Actually, a relationship between the nitrogen concentration NCon. and the barrier energy Ec and Ev was determined.

Figure 11:
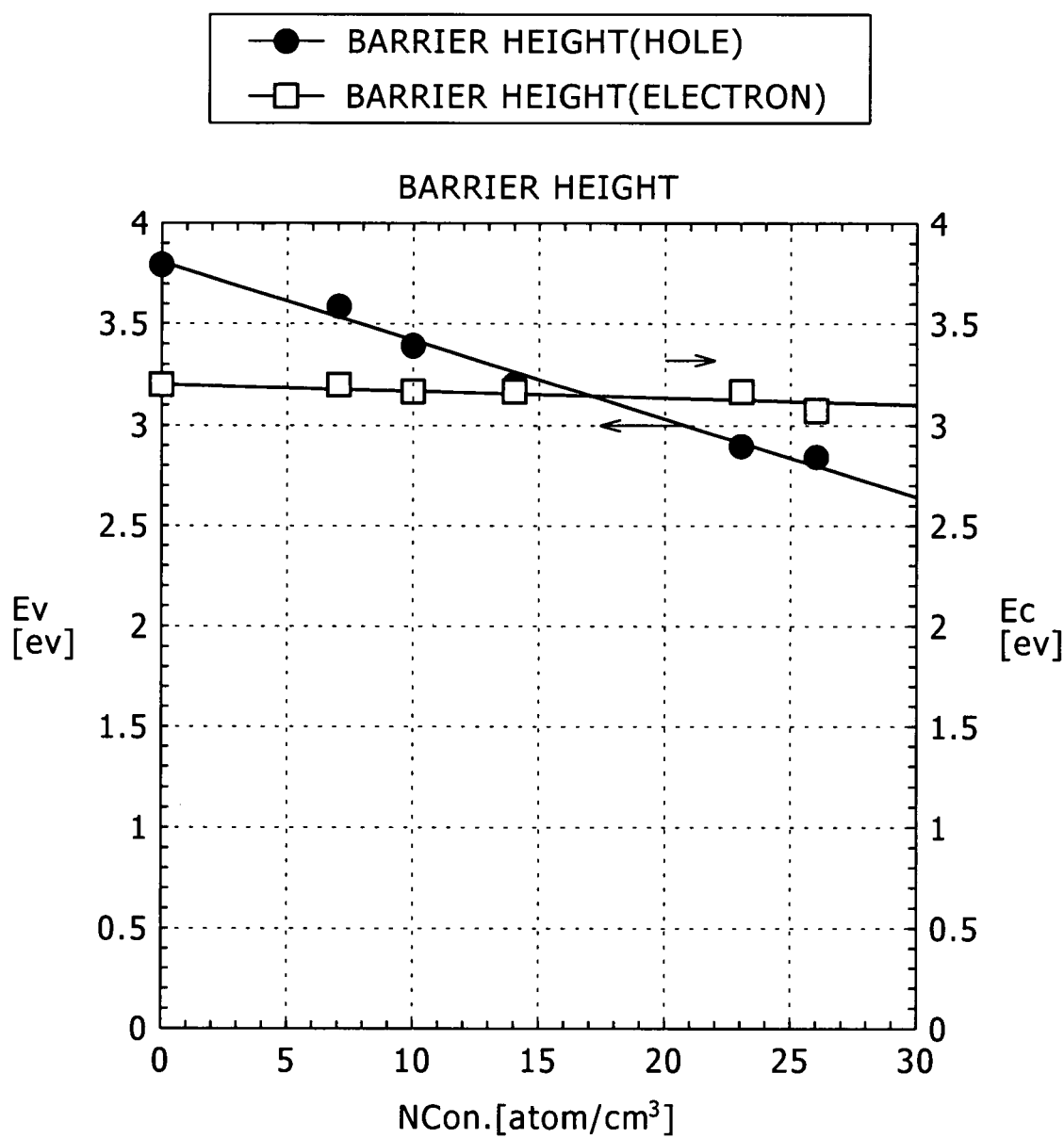
FIG. 11 is a graph illustrating the nitrogen concentration dependence of the barrier energy of SiON with respect to Si.

FIG. 11 illustrates the dependence of the nitrogen concentration NCon. of the barrier energy Ec and Ev of SiON with respect to silicon.

From this graph, it can be recognized that the barrier energy Ec and Ev with respect electrons and holes drops as the nitrogen concentration NCon. increases. Particularly, the dependence of the barrier energy Ev with respect to holes upon the nitrogen concentration NCon. is high. This signifies that the electron barrier with respect to holes can be made low while the potential barrier with respect to electrons which are an injection carrier is kept high. This characteristic is suitable to a writing or erasing method wherein holes are injected upon erasure (hereinafter described) to cancel the charge amount of the accumulated charge.

Further, by making use of the characteristic to gradually vary the nitrogen concentration NCon. upon formation of the laminated insulating film 12, a graded potential distribution wherein the potential distribution of a SiON film with respect to Si gradually varies in the laminated insulating film 12 can be implemented.

The present embodiment is characterized in that the laminated insulating film 12 has a graded potential distribution.

By an effect of the graded potential distribution, appearance of an interference level on an interface between the oxynitride films 120A and 120B and an interface between the oxynitride films 120B and 120C can be suppressed. Consequently, leak current arising from a trap assisted tunnel effect which flows through the interface level can be reduced.

A SiON film having a composition in which the nitrogen concentration varies in a graded manner can be formed comparatively readily as described below.

Where plasma nitriding processing is performed for an ordinary oxide film, a SiON film having a nitrogen peak at an interface thereof with a Si substrate and at the surface thereof is formed.

As the nitrogen concentration in the oxide film increases, the physical properties of the SiON film approach those of a SiN film, and the energy barrier of the conduction band and the valence band with respect to the Si substrate is relatively small when compared with the SiON film having a low nitrogen composition ratio.

Therefore, when a three-layer film is to be formed, formation of $SiO_2$ and plasma nitriding processing are repeated three times. Thereupon, the nitriding processing conditions are controlled so that the barrier energy of the oxynitride films 120A and 120C with respect to silicon is lower than the barrier energy of the oxynitride film 120B with respect to silicon.

Consequently, leak current arising from a trap assisted tunnel effect can be reduced, and writing and erasure can be performed and deterioration of the data retaining property can be suppressed as much.

Such a potential distribution of a pseudo three-layer structure as described above allows writing and erasure at a low voltage and allows suppression of the deterioration of the data retaining property.

Figure 12:
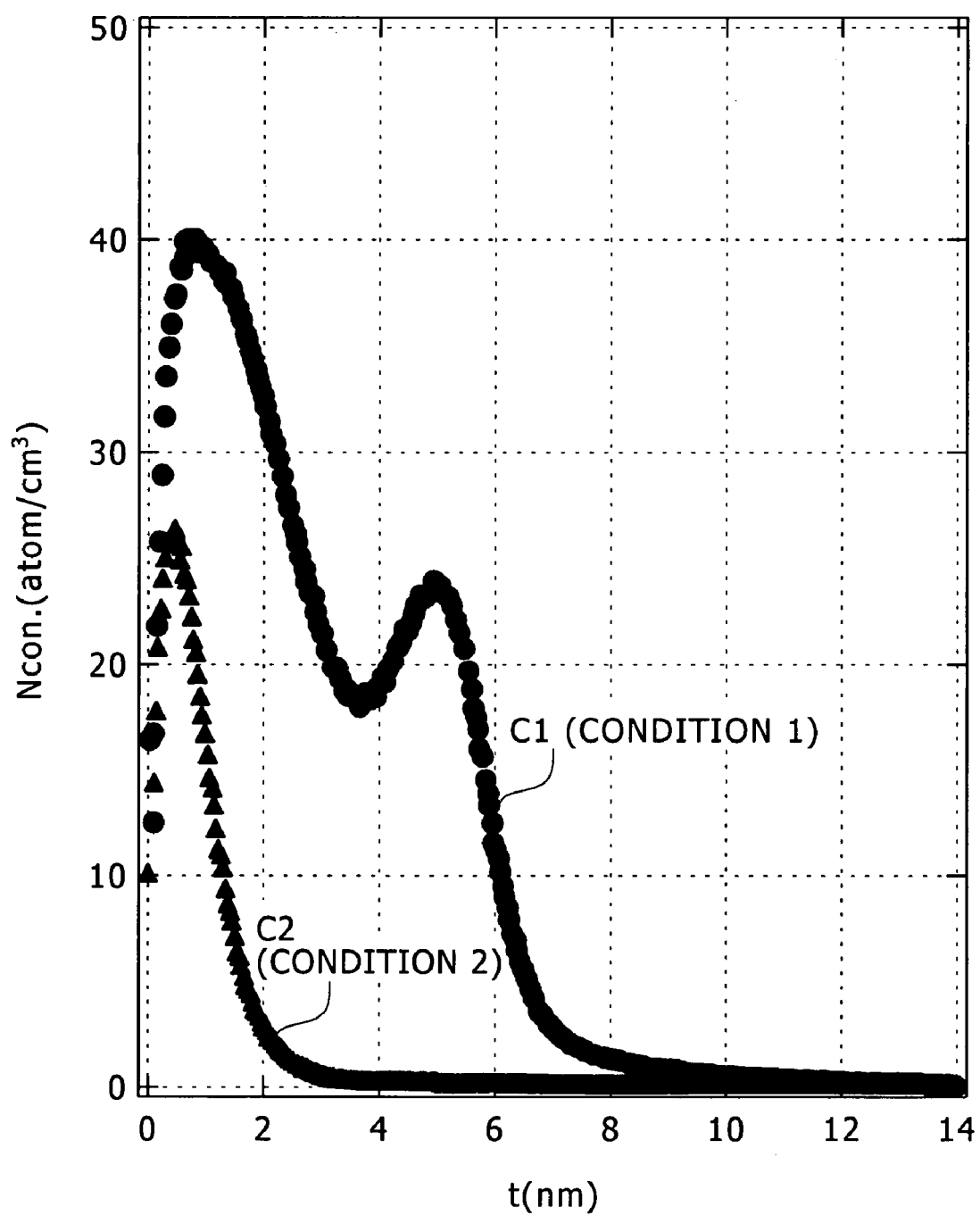
FIG. 12 is a graph illustrating the film formation condition dependence of the nitrogen concentration distribution.

FIG. 12 illustrates the film formation condition dependence of the nitrogen concentration NCon. distribution.

Referring to FIG. 12, conditions indicated by C1 (Condition 1) and C2 (Condition 2) were produced in different RF conditions while the heater temperature upon film formation was equally set to 550° C. The specimen produced in C1 (Condition 1) has a bottom insulating film 12A of 4.5 nm in terms of an oxide film, and the specimen produced in C2 (Condition 2) has a bottom insulating film 12A of 2.5 nm in terms of an oxide film.

The specimen of C1 (Condition 1) has a distribution of the nitrogen concentration NCon. which has two peaks such that the barrier energy of the oxynitride films 120A and 120C with respect to silicon is lower than the barrier energy of the oxynitride film 120B with respect to silicon. Meanwhile, the specimen of C2 (Condition 2) has a distribution of the nitrogen concentration NCon. which has one peak, and does not satisfy the requirement regarding the barrier energy described hereinabove.

In this manner, it was found out that the variation of the nitrogen concentration NCon. and the barrier energy of the bottom insulating film 12A in the film thicknesswise direction can be controlled by the RF power of the plasma nitriding apparatus. It is to be noted that the distribution also varies depending upon the heater temperature, and also control according to this condition is possible.

Further, the variation of the nitrogen concentration NCon. and the barrier energy of the bottom insulating film 12A in the film thicknesswise direction can be controlled through the high temperature annealing gas type (for example, NO, $O_2$, $O_2/N_2$), temperature and time after the plasma nitriding processing.

By performing high temperature annealing, N—$O_2$ bonds, wherein the chemical bond state of a nitrogen atom is comparatively unstable, disappear in the bottom insulating film (SiON film) while only N—$Si_3$ bonds, which are comparatively stable, remain. Thus, it was confirmed by an XPS method that the film quality of the bottom insulating film is improved.

FIG. 13 illustrates, in the form of a table, the peak concentration of the nitrogen concentration NCon. and the depth of the peak from the surface of the laminated insulating film 12 regarding specimens of numbers #01, #03, #05, #07, #09, #11 and #17 where the film formation conditions were varied variously.

From among the specimens mentioned, the specimens of the numbers #11 and #17 exhibit one concentration peak while the other specimens exhibit two concentration peaks. From this table, it can be recognized that the controllability is high and optimization is easy.

From the foregoing, potential control and optimization of the pseudo three-layer structure of the laminated insulating film 12 can be made by controlling the nitrogen peak concentration and the peak depth of the laminated insulating film 12 which has a potential distribution of the pseudo three-layer structure with parameters used upon film formation and upon plasma processing.

As a result, the laminated insulating film 12 having a potential distribution of a pseudo three-layer structure as described above can be implemented. Consequently, a discrete trap type nonvolatile memory can be implemented which allows writing and erasure with a low voltage and which can suppress deterioration of the data retaining characteristic.

<<Fabrication Method of the Memory Transistor: Outline>>

Now, an outline of a fabrication method of the memory transistor is described. It is to be noted that the following description is given on the basis of the memory cell array described hereinabove with reference to FIGS. 5 to 7. Also, it is to be noted that the following description can be applied also to the memory cell array described hereinabove with reference to FIGS. 2 to 4, although there is a difference in that it is necessary to perform the formation of the source-drain region and the high concentration channel region (and ion implantation for threshold value adjustment) before the formation of the gate structure.

In the fabrication of the memory transistor of such a configuration as described above, an element isolating insulating layer ISO and a P well W are formed on a prepared semiconductor substrate SUB.

Then, a laminated insulating film 12 is formed on the semiconductor substrate SUB on which the P well W and the element isolating insulating layer ISO are formed. As occasion demands, ion implantation for threshold voltage adjustment is performed.

In particular, as the bottom insulating film 12A, an oxide film is formed first, for example, with a thickness of 6 nm by a dry thermal oxidation method. Then, plasma nitriding is performed at 650° C. by a plasma processing method, and then the plasma nitride film is heat processed at 800° C. in an NO atmosphere to make the film dense.

The bottom insulating film 12A preferably has a film thickness of 4 to 10 nm in terms of an oxide film and in the present embodiment has a film thickness of 6 nm.

The bottom insulating film 12A may be formed not from a $SiO_2$ film but from various silicate films, such as a SiON film and a SiN film, or from a high dielectric constant (High-k) material film, such as an alumina film. For the formation of the laminated insulating film 12, conditions in which the nitrogen concentration NCon. distribution described hereinabove can be optimized are used.

A silicon nitride film (charge storage film 12B) is deposited in a rather great thickness on the bottom insulating film 12A by a LP-CVD method such that the final film thickness may be 5 nm. This CVD is performed at a substrate temperature of 750° C. using a mixture gas of dichlorsilane (DCS) and ammonia.

The top insulating film 12C is formed from a silicon oxide film, for example, by an HTO (High Temperature Oxide) method.

Or, the surface of the charge storage film 12B (for example, a silicon nitride film) may be oxidized by a thermal oxidation method to form a silicon oxide film (top insulating film 12C) of, for example, 6 nm. This thermal oxidation is performed, for example, at a furnace temperature of 950° C. in a $H_2O$ atmosphere. As a result, comparatively deep carrier traps whose trap level (energy difference from the conduction value of the silicon nitride film) is less than 2.0 eV are formed at a concentration of approximately 1 to $2\times10^{13}/cm^2$. Further, a thermal oxide silicon film (top oxide film TOP) is formed by 1.5 nm with respect to 1 nm of the silicon nitride film (charge storage film 12B). At this ratio, the silicon nitride film thickness of the base decreases until the final film thickness of the silicon nitride film becomes 6 nm.

A laminated film of an offset insulating layer (not shown) and a conductive film from which a gate electrode (word line WL) is to be formed is laminated and is collectively worked into the same pattern. At this time, the laminated insulating film 12 also is worked into the same pattern.

Impurity regions (source regions 17S and drain regions 17D) from which the sub bit lines SBL and the sub source lines SSL are to be formed are formed by an ion implantation method. Then, the high-concentration channel regions 15 are formed by an oblique ion implantation method or the like.

Then, in order to obtain the memory cell array structure described hereinabove with reference to FIG. 7, self-aligning contact portions are formed together with a side wall insulating layer. Then, plugs, which are to be used as the bit contact plugs BC, and the source contact plugs SC are formed on the sub bit lines SBL and the sub source lines SSL exposed outside through the self-aligning contact portions.

Then, the plugs are embedded therearound by an interlayer insulating film, and main bit lines MBL and main source lines MSL are formed on the interlayer insulating film. Thereafter, as occasion demands, deposition of an interlayer insulating film, formation of contacts and formation of upper layer wiring lines are performed. Finally, an overcoat forming process, a pad opening process and so forth are performed thereby to complete the nonvolatile memory cell array.

Now, an example of bias setting and operation of the nonvolatile memory cell array shown in FIGS. 2 to 4 are described. It is to be noted that the memory cell array described hereinabove with reference to FIGS. 5 to 7 also operates basically similarly as described below.

Figure 14A:
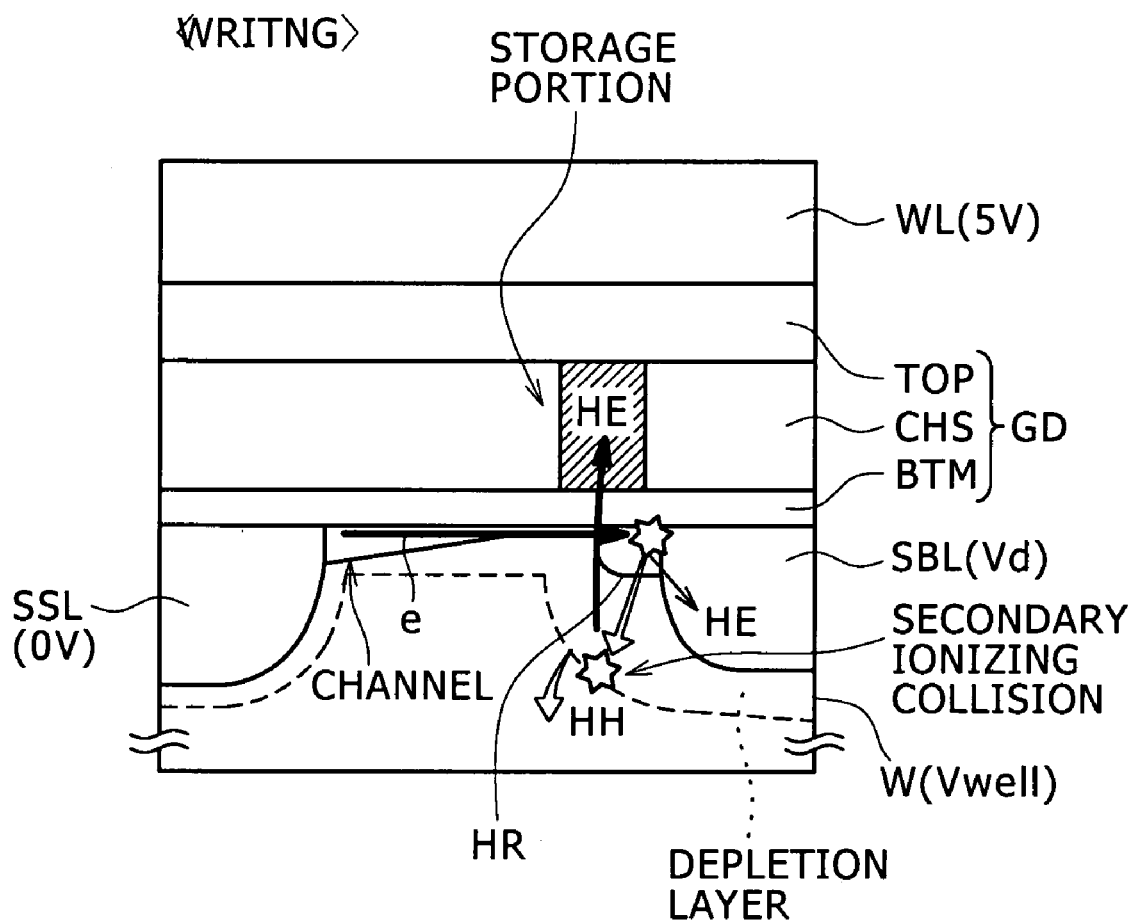
FIG. 14A is a diagrammatic view illustrating a concept of data writing operation.
Figure 14B:
FIG. 14B is a diagram illustrating an acceleration electric field for electrons in a channel direction.

FIG. 14A illustrates a data writing operation, that is, hot electron implantation, and FIG. 14B illustrates an acceleration electric field E for electrons in a channel direction.

In the present embodiment, writing is performed by implantation of hot electrons generated by secondary ionizing collision, which is a kind of an ionizing collision phenomenon.

In particular, with reference to the voltage of 0 V at the source (sub source line SSL), 3 to 4 V is applied to the gate (in FIG. 8, corresponding to the gate electrode 13, here, the word line WL), and Vd=3 to 3.5 V is applied to the drain (in FIG. 8, the drain region 17D, here the sub bit line SBL). Further, as a back bias, a voltage Vwell for reversely biasing the PN junction between the P well W and the source (in FIG. 8, corresponding to the source region 17S, here the sub source line SSL) or the sub bit line SBL, for example, −3 V, is applied. At this time, the voltage to be applied between the sub bit line SBL and the P well W is selected so as to be lower than the withstanding voltage of the sub bit line SBL and the P well W.

In this bias condition, electrons e, which are supplied from the sub source line SSL and travel in the channel, collide with silicon gratings or are scattered by the silicon gratings within a depletion layer on the sub bit line SBL side on the drain side. Thereupon, pairs of a hot hole HH and a hot electron HE of high energy are generated.

Between the hot holes HH and the hot electrons HE, the hot holes HH are accelerated in the depletion layer of the PN junction and collide with the gratings again, whereupon pairs of an electron and a hole are produced. Then, the electrons become hot electrons HE and drift, and part of them are directed to the word line WL side and are further accelerated by an electric field in a vertical direction. The hot electrons HE having acquired the high energy ride over the energy barrier of the bottom insulating film GD (in FIG. 8, the bottom insulating film 12A) and are caught by the carrier traps in the bottom insulating film GD. The charge catching region (storage section) is limited to part of the drain side.

At this time, the implantation probability of electrons (or holes) by a Thermo Electron model represented by the following expression (1-1) satisfies the following expression (1-2).

$$Ig \propto Id^* \exp\{-B^* q^* \Phi b/(k^* Te)\} \quad (1\text{-}1)$$

$$P(Te) \propto Id^* \exp\{-B^* q^* \Phi b/(k^* Te)\} \quad (1\text{-}2)$$

where "P(Te)" is the implantation probability of electrons, "Φb" is the barrier energy, "k" is the Boltzmann constant, "Te" is the electron temperature, and "A" and "B" are constant.

From the expression, it can be recognized that the implantation probability of electrons depends exponentially upon the barrier energy. Also, the implantation probability of holes is represented by a similar expression.

In the case of an ionizing collision, hot electrons HE are generated in a lower electric field than in the case of a CHE implantation method, wherein hot electrons HE are accelerated simply in the channel so as to have higher energy.

Further, in the present embodiment, since the high-concentration channel region 15 (in FIG. 14A, indicated by reference character "HR") is provided, the concentration of the electric field in the channel direction is higher than that in an alternative case wherein the high-concentration channel region HR is not provided, as indicated by a broken line in FIG. 14B. This increases the energy with which the electrons e collides with the silicon grating. Or, the source-drain voltage can be decreased in order to obtain the same energy. In the present embodiment, although formation of the high-concentration channel region HR is not essentially required, it is more preferable to form the high-concentration channel region HR for the reason described above.

Furthermore, the PN junction between the P well W and the n+ impurity region which forms the sub bit line is biased reversely by the back bias, and consequently the depletion layer is liable to be expanded at a comparatively low drain voltage. Even if the application voltage to the gate electrode is set lower than that where the back bias is not applied, a necessary implantation efficiency of hot electrons can be obtained readily.

In conventional nonvolatile memories, a transistor called a $V_{PP}$ type transistor having a high-voltage withstanding property from ten and several V to a voltage higher than 20 V is required. Formation of such a transistor as just described is low in commonness in process to a $V_{CC}$ type transistor or a logic circuit transistor. Besides, the formation mentioned increases the scale of a boosting circuit for producing the necessary voltage and hence increases the power consumption. The nonvolatile memory of the present embodiment is advantageous in this regard.

Incidentally, the withstanding property for a voltage of approximately 4 to 6 V also is demanded by general $V_{CC}$ type circuits. In particular, an I/O transistor, which is used at the input/output (I/O) stage of a $V_{CC}$ type circuit and is influenced by a signal from the outside, is usually designed so as to have a higher voltage withstanding property than the other transistors through such a countermeasure provided on a pattern as the provision of some offset even if an ordinary use voltage is the power supply voltage $V_{CC}$. Or, some process parameters, such as a gate insulating film thickness, are sometimes set differently from those of the other high speed logic transistors. Further, the burn-in voltage of I/O transistors is approximately 4 to 5 V, and it is frequently described in reliability specifications of an I/O transistor that the I/O transistor is not broken down by application of the voltage for several seconds.

In the present embodiment, the I/O transistors are designed commonly to medium voltage withstanding transistors of the memory peripheral circuits, at least in terms of the process, although they are different in pattern, such as the presence/absence of an offset and the offset amount. The I/O transistors may be fabricated by a process the same as or somewhat different from that for the other logic transistors. However, whichever process is used, the processes for the memory peripheral circuit and the logic section are common at least in part thereof, but preferably in the entirety.

Further, where it is intended to assure a sufficient margin, the offset amount on a pattern can be increased to achieve the intention. In this instance, the process itself may be common to that for I/O transistors and ordinary logic circuit transistors. Where it is desired to ensure a further margin, in the present embodiment, while at least the gate insulating film specifications are set common, a difference may be provided between profiles of the impurity distribution of the drain side.

In the nonvolatile memory device according to the present embodiment, a writing method having a high charge injection efficiency is adopted, and voltage application to the word line and the drain upon erasure is performed using a voltage of a first polarity and another voltage of a second polarity which have the opposite polarities to each other and are produced separately from each other. Therefore, the necessity for a high voltage withstanding transistor of the $V_{PP}$ type is eliminated, and the gate insulating film thickness and the gate length can be scaled as much.

The nonvolatile memory device of the present embodiment can be fabricated by a fabrication process simplified very much from that of a hitherto known fabrication process.

The fabrication method for the nonvolatile memory device according to the present embodiment is advantageous in that, since the memory transistors of the memory peripheral circuits and the logic circuits are formed simultaneously in the same size, the fabrication steps are simplified and the yield can be enhanced readily because of an increase of common fabrication steps.

The memory cell array formed by the fabrication method described above was investigated in terms of the writing characteristic.

In the investigation of the writing characteristic, the variation of the threshold voltage Vth with respect to the program time (writing time) was checked. MONOS transistors used in the characteristic evaluation were fabricated so that the high-concentration channel region 15 had a concentration of $1 \times 10^{18}$ cm$^{-3}$. The writing conditions were such that both of the gate voltage Vg and the drain voltage Vd were set to 3.5 V and the back bias voltage Vb was used as a parameter and varied within a range from 0 V to −3.5 V. To this end, the impurity concentration of the high-concentration channel region 15 was raised.

A good result was obtained in regard to the writing characteristic.

Then, the writing characteristic when the gate voltage Vg and the drain voltage Vd were varied was investigated. The writing characteristic was checked when both the gate voltage Vg and the drain voltage Vd were varied among 3 V, 3.5 V and 4.0 V and when the gate voltage Vg was 3.5 V and the drain voltage Vd was 3 V while the back bias voltage Vb was Vb=−3 V.

The investigation indicated a very reasonable result in which the Vth shift amount is greater and the writing speed is higher when the writing voltage is higher. Further, the it was found out that the possibility of operation at a voltage lower than a maximum voltage of 3.5 V, for example, at 3 V, was obtained.

Further, the current-voltage characteristic of the memory transistor in a writing state and an erasing state was investigated.

The measurement of the current-voltage characteristic of the memory transistor in a writing state exhibited a result in which, where both of the gate voltage Vg and the drain voltage Vd were 3.5 V and the back bias voltage Vb was −3 V, the drain current Id was Id=15 nA/μm and the substrate current Ib was Ib=2.5 nA/μm. Consequently, it was found that the current-voltage characteristic of the memory transistor in a writing state is reduced significantly in comparison with the current of 100 to 250 μA/μm of those of a memory transistor fabricated by ordinary CHE implantation.

Also, the readout voltage was low. Therefore, according to the present embodiment, a reduction of the power consumption can be implemented.

As regards the erasure characteristic, since the energy barrier of the valence band is reduced, as seen in FIG. 10, a reduction of the voltage from a traditionally used voltage can be achieved.

For example, when holes were implanted into the charge storage film by implantation of hot holes generated by interband tunneling to perform erasure, the erasure was performed successfully with a drain voltage of 3.5 V and a gate voltage of −3.0 V. It was found that, in order to further raise the erasing speed, it was effective to apply a substrate bias (for example, −2 V) upon erasure.

It is to be noted that it is also possible to draw out electrons using an FN implantation mechanism or implant holes to perform erasure.

Also, the readout current was investigated.

In particular, the readout current characteristic (drain voltage Vd=0.5 V) was investigated.

As a result of the investigation, it was found that, when the readout gate voltage was 3 V and the readout drain voltage was 0.5 V, a readout current of approximately 80 μA/μm was obtained per 1 μm of the gate width.

Further, the off leak current value from an unselected cell at the drain voltage of 3.5 V was as low as approximately 1 nA where the readout gate voltage was 3.5 V.

Since the readout current in this instance is higher than 1 μm, readout of an unselected cell in error does not occur. Accordingly, the margin to the punch-through withstanding voltage upon readout of a MONOS type memory transistor having a gate length of 130 nm is sufficient.

Also, the read disturb characteristic at a gate voltage Vg=3.5 V was evaluated. It was found that readout is possible also after a lapse of time of $3 \times 10^8$ sec or more.

Through various investigations, also it was found that the punch-through also can be suppressed where the drain voltage Vd upon writing is Vd=4 V.

Further, it was confirmed that the data retaining property and the data rewriting property are good.

From the foregoing, a MONOS type nonvolatile memory transistor having sufficient characteristics is obtained even where the gate length is smaller than 130 nm.

In the present embodiment, if a pin-off point exists intermediately at a portion of the channel formation region below the retaining region of injected charge, then this is preferable because forward reading can be performed more effectively.

To this end, for example, the value of the voltage to be applied upon writing and the application time should be adjusted such that hot electrons are implanted into the bottom insulating film GD (laminated insulating film 12) so as to reach at least a distance of 20 nm toward the channel center side from the boundary between the N-type impurity region (sub bit line SBL) of the drain side and the high-concentration channel region 15. The neutral threshold voltage in this instance, that is, the threshold voltage at a portion below the region in which implanted charge does not exist depending upon channel doping, is preferably set lower than 1.5 V in average.

By the setting, since the entire channel formation region below the implanted charge retaining region does not pinch off and the neutral threshold voltage is sufficiently low, a threshold voltage variation by charge injection can be detected readily by forward reading.

In order to reduce the off leak current from an unselected cell, the unselected word line upon readout should be biased with a somewhat negative voltage. Or, the source line may be biased somewhat in the positive direction. For example, 0 V is applied to the unselected word lines while preferably a voltage higher than 0 V but lower than 0.5 V, for example, 0.3 V, is applied to all source lines instead.

A system LSI configured so as to implement one system or implement a subsystem itself from a single LSI frequently incorporates a nonvolatile memory. For a nonvolatile memory for the system LSI application, commonness to a CMOS process and various high performances based on a high speed operation are demanded.

The nonvolatile memory device of the present embodiment is particularly suitable for a system LSI application since it can operate with a low voltage and has a high degree of commonness in the process of a memory transistor to logic transistors and peripheral transistors.

Further, the nonvolatile memory device of the present embodiment implements a high speed operation while eliminating the necessity for a special gate structure, such as the gate structure of an FG type floating gate or a MONOS type gate of the source side implantation system. Accordingly, the nonvolatile memory device of the present embodiment is advantageous in that it involves a reduced number of process steps and a reduced number of photomasks and is high in commonness to a CMOS process, and besides it has a high total performances as a nonvolatile memory that is applied so as to be incorporated in a system LSI or the like.

The MONOS memory of the present invention can be applied to various applications.

Generally, a general purpose nonvolatile semiconductor memory device which is the mainstream at present frequently assures rewriting by 100,000 times. However, since a nonvolatile semiconductor memory device is used widely as a rewritable storage medium for various data, where the application is limited suitably, the case wherein the number of times of rewriting ranges from several times to several tens of times at the greatest is increasing.

For example, it is sometimes the case that the number of times of rewriting is limited in order to protect the interests of the owner of the copyright. Or, in the field of the system LSI and so forth, a nonvolatile semiconductor memory device is sometimes configured such that some function is electrically selected in accordance with a demand of a client or a predetermined property value such as, for example, a supply voltage value is varied in accordance with a demand of a client, and, to this end, a nonvolatile memory array whose data can be rewritten electrically is embedded in a portion of an IC. In this application, the bit number M of input data or the maximum rewriting time number N is in most cases determined in advance.

Further, one of other applications to which the present invention can be applied is an analog trimming application wherein the resistance is adjusted in order to vary the supply voltage value. In such an application, as just mentioned, it is known that the sufficient number of times of rewriting of data is approximately 10 in the maximum. The present invention can be applied also to a MONOS type nonvolatile memory device in which a nonvolatile memory cell array is incorporated together with logic circuits so that it has the analog trimming function described above. Since the required bit number in the trimming applications is as small as 100 to 1,000, rewriting of the write-once read-many type by approximately 100 times may be used.

Also, the trimming technique for an analog circuit has been and is being refined depending upon the generation of ICs, and as a result, use of a lower voltage for peripheral circuits is proceeding. Particularly, in the generation later than that of 90 nm, also, the maximum voltage of peripheral circuits is reduced from 3.3 V to 2.5 V, depending upon the object. It is estimated that the maximum voltage when transistors of the 2.5 V specification operate is approximately 3.5 V where the number of times of rewriting is small.

In the present embodiment, since operation with the maximum voltage of 3.5 V is permitted, even if further refinement proceeds in the generation later than the 90 nm generation, the processes for peripheral circuits, high-voltage withstanding transistors and transistors of the 2.5 V specification of logic circuits can be made common among them. Therefore, where a nonvolatile memory is incorporated in a mixed manner in an IC, the number of additional masks can be reduced, for example, by approximately three, by which a reduction in cost can be anticipated.

<<Modifications>>

Also, the memory transistor structure in the embodiment described above can be modified in various manners. Such modifications are described below.

A memory transistor may not necessarily be formed on a semiconductor substrate. The "semiconductor substrate having a channel formation region" in the present invention includes not only a substrate bulk but also a well, as in the embodiment described hereinabove. Where a SOI type substrate structure is employed, an insulating film is formed on a substrate, and a SOI semiconductor layer is formed on the insulating film. The SOI semiconductor film in this instance can be used as the "semiconductor substrate having a channel formation region" in the present invention.

Figure 15:
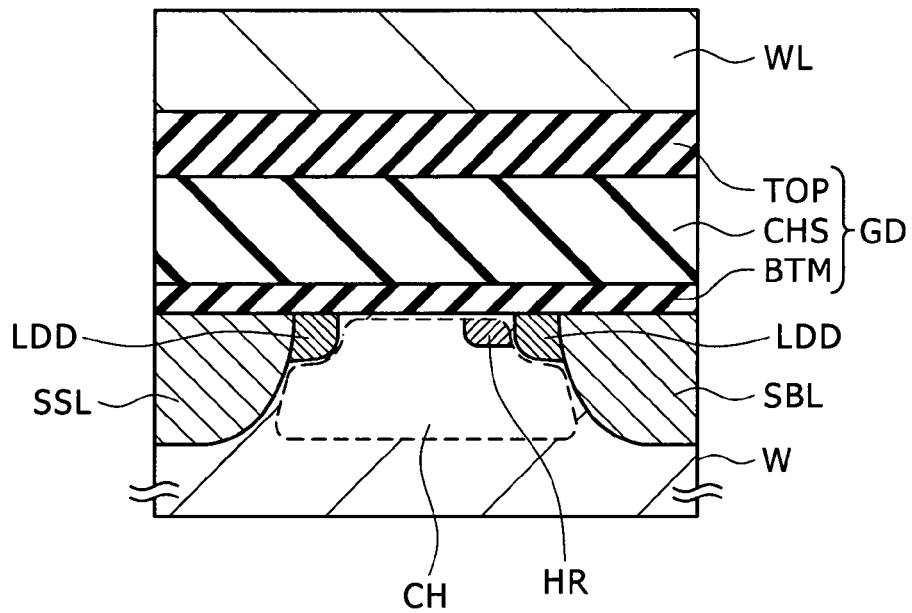
FIG. 15 is a schematic cross sectional view showing a modified memory transistor structure.

FIG. 15 shows a cross section of the memory cell array shown in FIGS. 2 to 4 where a high-concentration channel region HR is formed.

Referring to FIG. 15, at inner side ends of a sub bit line SBL and a sub source line SSL (or only at an inner side end of the sub bit line SBL) which are formed from an N-type impurity region, an N-type low-concentration impurity region LDD of a further lower concentration is provided. The high-concentration channel region HR is formed contiguously to a channel center side end of the low-concentration impurity region LDD, for example, on the sub bit line SBL side. The high-concentration channel region HR may be formed on the opposite sides of the channel.

The low-concentration impurity region LDD, for example, in the memory cell array shown in FIG. 3, can be formed in a process of forming the sub bit line SBL and the sub source line SSL in a shape of parallel lines in a well. In particular, a masking layer having a shape of parallel lines is formed on the well, and an N-type impurity is ion implanted first in a low concentration into the surface of the well around the masking layer to form a low-concentration impurity region LDD. Then, a spacer layer of the shape of side walls is formed on the two opposite side faces in a widthwise direction of the masking layer, and an N-type impurity is ion implanted in a higher concentration into the surface of the well around the spacer layers thereby to form a sub bit line SBL and a sub source line SSL.

The high-concentration channel region HR can be formed by introducing a P-type impurity into a lower portion of one end portion of the masking layer by an oblique ion implantation method immediately after the masking layer is formed or after the ion implantation is performed upon formation of the low-concentration impurity region LDD.

As described hereinabove, it is not essential to the present embodiment to provide the high-concentration channel region HR. However, where the high-concentration channel region HR is formed, the implantation efficiency of electrons is higher than that of a device structure which does not include the high-concentration channel region HR.

It is further preferable to form both the high-concentration channel region HR and the low-concentration impurity region LDD. In this instance, since, to channel traveling carriers (electrons), the low-concentration impurity region LDD functions as a low resistance region, the relative resistance ratio of the adjacent high-concentration channel region HR becomes higher, and consequently, a greater voltage drop becomes likely to occur in the high-concentration channel region HR. Therefore, the steepness of the channel direction electric field is further raised in the high-concentration channel region HR, and the electron implantation efficiency rises as much. Accordingly, further high speed writing can be anticipated.

Discrete conductors may be used as a charge storage section of a memory-transistor. Here, a memory transistor is described wherein a large number of mutually isolated conductors (hereinafter referred to as small diameter conductors) having a particle size smaller than, for example, 10 nm and embedded in a gate insulating film are used as the charge storage section.

Figure 16:
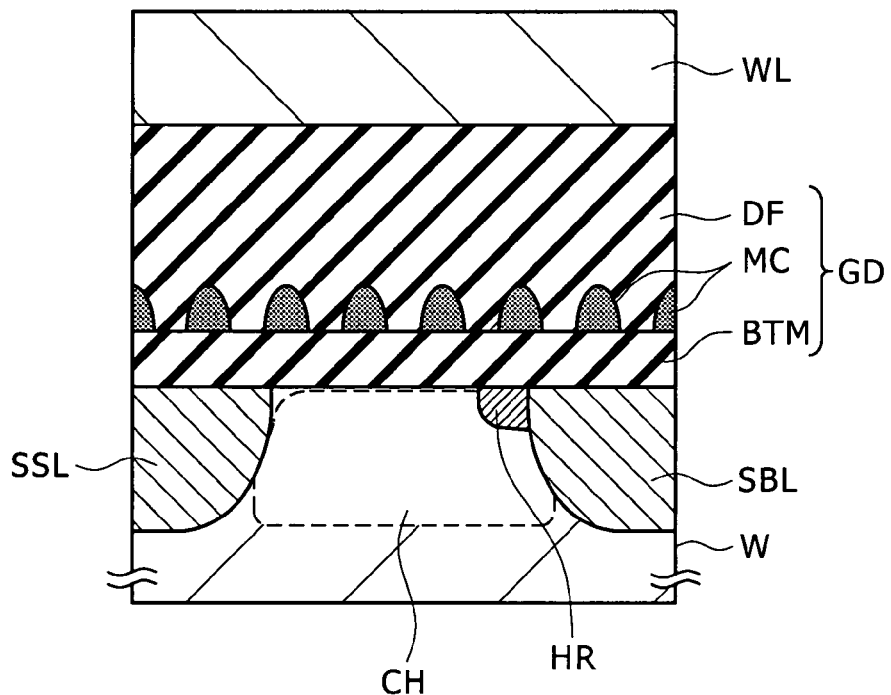
FIG. 16 is a schematic cross sectional view showing another modified memory transistor structure.

FIG. 16 shows in cross section a structure of a memory transistor wherein small diameter conductors are used as the charge storage section.

Referring to FIG. 16, the memory transistor shown includes a bottom insulating film GD (corresponding to the laminated insulating film 12 shown in FIG. 8) which, in turn, includes a bottom insulating film BTM, discrete small diameter conductors MC formed on the bottom insulating film BTM and serving as the charge storage section, and a second potential barrier film DF for covering the small diameter conductors MC.

The other components, that is, a P well W, a channel formation region CH, (a high-concentration channel region 15), a second source-drain region (sub bit line) SBL, a first source-drain region (sub source line) SSL and a gate electrode (word line WL), are similar to those described hereinabove with reference to FIG. 15, except that the low-concentration impurity region LDD is omitted. It is to be noted that the low-concentration impurity region LDD also may be formed in the memory transistor.

Each of the small diameter conductors MC is formed from a very fine conductor, such as amorphous $Si_xGe_{1-x}$ ($0 \leqq x \leqq 1$), polycrystalline $Si_xGe_{1-x}$ ($0 \leqq x \leqq 1$) or the like. The size (diameter) of the small diameter conductors MC is preferably smaller than 10 nm, for example, approximately 4.0 nm. The individual small diameter conductors are spatially separated from each other by a distance of, for example, approximately 4 nm by the second potential barrier film DF.

The bottom insulating film BTM in the present embodiment can have a dimension suitably selected from within a range from 2.0 nm to 6.0 nm depending upon the application.

A fabrication method of the memory transistor shown in FIG. 16 is described.

After a P well W, a sub bit line SBL and a sub source line SSL (as well as a high-concentration channel region HR) are formed, a bottom insulating film BTM (bottom insulating film 12A shown in FIG. 8) is formed by a method similar to that described hereinabove in connection of the present embodiment.

For example, an aggregate of small diameter conductors MC of $Si_xGe_{1-x}$, which are produced at an initial stage of the $Si_xGe_{1-x}$ film formation in which, for example, a LP-CVD method is used, is formed on the bottom insulating film BTM. The small diameter conductors MC of $Si_xGe_{1-x}$ are formed at a film formation temperature of approximately 500° C. to 900° C. using silane ($SiH_4$) or dichlorsilane (DCS), germane ($GeH_4$) and hydrogen as raw material gases. The concentration and the size of the small diameter conductors MC can be controlled by adjusting the partial pressure or the flow ratio of the silane or dichlorsilane and the hydrogen. The concentration of nuclei based on which the small diameter conductors MC are formed can be raised by raising the partial pressure of hydrogen. Or, an aggregate of small diameter conductors MC of $Si_xGe_{1-x}$ separate from and embedded in $SiO_2$ is formed by forming $SiO_x$ of a non-stoichiometric composition at a film formation temperature of approximately 500 to 800° C. using silane or dichlorsilane and nitrogen monoxide ($N_2O$) as raw material gases and by annealing it in a high-temperature of 900 to 1100° C.

A second potential barrier film DF is formed, for example, by approximately 7 nm by LP-CVD in such a manner as to embed the small diameter conductors MC. In the LP-CVD, a mixture gas of dichlorsilane (DCS) and nitrogen monoxide is used as the raw material gas, and, for example, 700° C. is used as the substrate temperature. At this time, the small diameter conductors MC are embedded in the second potential barrier film DF.

Thereafter, a conductor film from which the word line WL is to be formed is formed, and a process of patterning the conductor film at a time is performed to complete the memory transistor.

The small diameter conductors MC formed in this manner function as carrier traps discretized in a planar direction. Each of the small diameter conductors MC can retain several implantation electrons. It is to be noted that each of the small diameter conductors MC may otherwise be formed so small that it retains a single electron.

The structure of the bottom insulating film GD (laminated insulating film 12) of the memory transistor is not limited to that of the three-layer dielectric film or the small diameter conductor type structure used in the MONOS type memory transistor described principally in the description of the embodiment. The requirement for the gate insulating film is that charge storage elements, such as charge traps, are in a discretized state, and various other configurations can be adopted only if they satisfy this requirement.

For example, a memory transistor may have a two-layer structure including a bottom insulating film BTM (bottom insulating film 12A of FIG. 8) made of silicon dioxide or the like and a film CHS made of silicon nitride or the like formed on the bottom insulating film BTM and having a charge retaining capacity like a MNOS type memory transistor.

It is known also that a dielectric film made of metal oxide, such as aluminum oxide $Al_2O_3$, tantalum oxide $Ta_2O_5$ or zirconium oxide $ZrO_2$ or the like, includes many traps and can be adopted for a film CHS (charge storage film 12B of FIG. 8) having a charge retaining capacity where it has a film structure similar to that of a MONOS type or MNOS type memory transistor.

Further, the material of the bottom insulating film BTM (bottom insulating film 12A) may be some other metal oxide of, for example, titanium, hafnium or lanthanum or silicate of tantalum, titanium, zirconium, hafnium or lanthanum.

Where aluminum oxide ($Al_2O_3$) is selected as the material for the bottom insulating film BTM, for example, a CVD method wherein aluminum chloride ($AlCl_3$), carbon dioxide ($CO_2$) and hydrogen ($H_2$) are used as a raw material gas or a thermal decomposition of aluminum alkoxide ($Al(C_2H_5O)_3$, $Al(C_3H_7O)_3$, $Al(C_4H_9)_3$ or the like) is used.

Where tantalum oxide ($Ta_2O_5$) is selected as the material for the bottom insulating film BTM, for example, a CVD method wherein tantalum chloride ($TaCl_5$), carbon dioxide ($CO_2$) and hydrogen ($H_2$) are used as a raw material gas or a thermal decomposition of $TaCl_2(OC_2H_5)_2C_5H_7O_2$ or $Ta(OC_2H_5)_5$ is used.

Where zirconium oxide ($ZrO_x$) is selected as the material for the bottom insulating film BTM, for example, a method of sputtering Zr in an oxygen atmosphere is used.

In the formation methods described above, the charge storage film 12B may be formed from any material selected from aluminum oxide $Al_2O_3$, tantalum oxide $Ta_2O_5$ and zirconium oxide $ZrO_2$. It is to be noted that the formation method of the metal oxides is such as described above.

Further, the top insulating film 12C may be formed from some other metal oxide film, such as a film made of oxide of titanium, hafnium or lanthanum or a film made of silicate of tantalum, titanium, zirconium, hafnium or lanthanum.

As described above, the present embodiment has the following advantages.

In particular, by optimizing the potential distribution, that is, the barrier energy distribution, of the bottom insulating film 12A in accordance with the present invention, the leak current is reduced, which facilitates a reduction of the voltage. Further, in order to inject electrons at a low voltage, the nonvolatile semiconductor memory device has the high-concentration channel region HR. Where the impurity concentration of the high-concentration channel region HR is raised to concentrate an electric field on the high concentration region also at a low voltage, the initial threshold voltage Vth depends not upon the channel portion but upon the high concentration channel region.

On the other hand, in order to achieve readout using a low voltage, it is necessary to reduce also the readout voltage, and it is also necessary to design the initial threshold voltage Vth to a low voltage.

Low voltage writing and low voltage readout have a tradeoff relationship in the design of the initial threshold voltage Vth.

The present embodiment applies a phenomenon in which, for example, by performing a nitriding process with ammonia $NH_3$ at a high temperature, a factor which facilitates introduction of a positive charge into the bottom insulating film BTM is brought about, resulting in a reduction of the initial threshold voltage Vth. For example, a phenomenon in which the initial threshold voltage Vth is shifted to the negative by high temperature ammonia ($NH_3$) annealing is used to reduce the initial threshold voltage Vth thereby to raise the writing speed and make readout possible with a temperature lower than 3.5 V.

By the action described above, a trap memory which has a low initial threshold voltage Vth and operates at a low voltage can be implemented.

Therefore, the generation efficiency and the implantation efficiency of hot electrons or hot holes rise, and the voltage necessary to obtain a desired charge injection efficiency can be reduced.

To reduce the voltage leads to an increase of the commonness in process to memory peripheral circuits and logic circuits and a reduction of the cost. As a result, a less expensive nonvolatile memory device including logic circuits can be provided.

While a preferred embodiment of the present invention has been described using specific terms, such description is for illustrative purpose only, and it is to be understood that changes and variations may be made without departing from the spirit or scope of the following claims.

What is claimed is:

1. A nonvolatile semiconductor memory device, comprising:
    a memory transistor including
    a channel formation region defined between two source and drain regions formed on a semiconductor substrate,
    a bottom insulating film, a charge storage film and a top insulating film formed in order at least on said channel formation region, said charge storage film having a charge storage function, and
    a gate electrode formed on said top insulating film;
    said bottom insulating film being formed from a plurality of films containing nitrogen such that the content of nitrogen of a lowermost one of said films which contacts with said channel formation region and an uppermost one of said films which contacts with said gate electrode is higher than that of the other one or ones of said films which exist between the uppermost and lowermost films,
    wherein a barrier energy of said bottom insulating film with respect to silicon is lower than that of silicon oxide with respect to silicon,
    wherein said channel formation region has, at least on one side at least of the two source and drain regions, a high concentration channel region which has a conduction type the same as that of said channel formation region and has a concentration higher than that in the other region.

2. A nonvolatile semiconductor memory device comprising:
    a top insulating film between a gate electrode and a charge storage film, said top insulating film being a silicon nitride film;
    a bottom insulating film between said charge storage film and an active region, said bottom insulating film being another layer between an uppermost layer and a lowermost layer.

3. The nonvolatile semiconductor memory device according to claim 2, wherein said bottom insulating film is a plurality of films, said another layer being a film that is separate and distinct from said uppermost layer and said lowermost layer.

4. The nonvolatile semiconductor memory device according to claim 2, wherein said bottom insulating film is a single layer with said another layer, said uppermost layer and said lowermost layer being separate regions within said single layer.

5. A nonvolatile semiconductor memory device comprising:
    a top insulating film between a gate electrode and a charge storage film;
    a bottom insulating film between said charge storage film and an active region, said bottom insulating film being another layer between an uppermost layer and a lowermost layer,
    wherein a content of nitrogen of said uppermost layer is higher than a content of nitrogen of said another layer.

6. A nonvolatile semiconductor memory device comprising:
    a top insulating film between a gate electrode and a charge storage film;
    a bottom insulating film between said charge storage film and an active region, said bottom insulating film being another layer between an uppermost layer and a lowermost layer,
    wherein a content of nitrogen of said lowermost layer is higher than a content of nitrogen of said another layer.

7. The nonvolatile semiconductor memory device according to claim 2, wherein a barrier energy of said bottom insulating film with respect to silicon is lower than that of silicon oxide with respect to silicon.

8. A nonvolatile semiconductor memory device comprising:
    a top insulating film between a gate electrode and a charge storage film;
    a bottom insulating film between said charge storage film and an active region, said bottom insulating film being another layer between an uppermost layer and a lowermost layer,
    wherein a barrier energy of silicon with respect to said another layer is higher than a barrier energy of silicon with respect to said uppermost layer.

9. A nonvolatile semiconductor memory device comprising:
    a top insulating film between a gate electrode and a charge storage film;
    a bottom insulating film between said charge storage film and an active region, said bottom insulating film being another layer between an uppermost layer and a lowermost layer, wherein a barrier energy of silicon with respect to said another layer is higher than a barrier energy of silicon with respect to said lowermost layer.

10. A nonvolatile semiconductor memory device comprising:
- a top insulating film between a gate electrode and a charge storage film;
- a bottom insulating film between said charge storage film and an active region, said bottom insulating film being another layer between an uppermost layer and a lowermost layer,
- wherein said top insulating film is an oxynitride film.

11. The nonvolatile semiconductor memory device according to claim 2, wherein said top insulating film is a high temperature CVD oxide film.

12. The nonvolatile semiconductor memory device according to claim 2, wherein said charge storage film is a silicon nitride film.

13. A nonvolatile semiconductor memory device comprising:
- a top insulating film between a gate electrode and a charge storage film;
- a bottom insulating film between said charge storage film and an active region, said bottom insulating film being another layer between an uppermost layer and a lowermost layer,
- wherein said uppermost layer is a silicon nitride film or a silicon oxynitride film.

14. The nonvolatile semiconductor memory device according to claim 2, wherein said another layer is a silicon nitride film or a silicon oxynitride film.

15. A nonvolatile semiconductor memory device comprising:
- a top insulating film between a gate electrode and a charge storage film;
- a bottom insulating film between said charge storage film and an active region, said bottom insulating film being another layer between an uppermost layer and a lowermost layer,
- wherein said lowermost layer is a silicon nitride film or a silicon oxynitride film.

16. The nonvolatile semiconductor memory device according to claim 2, wherein said active region is a channel formation region, said channel formation region being between a source region and a drain region.

17. A nonvolatile semiconductor memory device comprising:
- a top insulating film between a gate electrode and a charge storage film;
- a bottom insulating film between said charge storage film and an active region, said bottom insulating film being another layer between an uppermost layer and a lowermost layer,
- wherein said active region is a channel formation region, said channel formation region being between a source region and a drain region,
- wherein a high-concentration channel region is between said channel formation region and said drain region, said channel formation region and said high-concentration channel region being of a conduction type.

18. The nonvolatile semiconductor memory device according to claim 17, wherein a concentration of an impurity of said conduction type in said high-concentration channel region is higher than a concentration of an impurity of said conduction type in said channel formation region.

* * * * *